United States Patent
Devashya Shivarama et al.

(10) Patent No.: US 12,353,350 B2
(45) Date of Patent: Jul. 8, 2025

(54) RADIO FREQUENCY INTERFERENCE COMMON MODE INJECTION IN A C-PHY RECEIVER

(71) Applicant: QUALCOMM Incorporated, San Diego, CA (US)

(72) Inventors: Panchami Devashya Shivarama, San Diego, CA (US); Ying Duan, San Diego, CA (US); Qinqing Cao, San Diego, CA (US); Seuk Son, San Diego, CA (US); Mansoor Basha Shaik, Bangalore (IN); Abhay Dixit, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 34 days.

(21) Appl. No.: 18/462,107

(22) Filed: Sep. 6, 2023

(65) Prior Publication Data

US 2025/0077462 A1     Mar. 6, 2025

(51) Int. Cl.
G06F 13/42     (2006.01)
G06F 13/40     (2006.01)

(52) U.S. Cl.
CPC ...... G06F 13/4282 (2013.01); G06F 13/4068 (2013.01)

(58) Field of Classification Search
CPC .................................................. G01N 35/1002
See application file for complete search history.

(56) References Cited

U.S. PATENT DOCUMENTS

| | | |
|---|---|---|
| 6,295,323 B1 | 9/2001 | Gabara |
| 6,545,555 B1 | 4/2003 | Justice et al. |
| 6,735,657 B1 * | 5/2004 | Falk ...................... H04L 5/1461 710/305 |
| 8,693,557 B1 | 4/2014 | Zhang et al. |
| 8,947,131 B2 * | 2/2015 | Lee ........................ H02M 3/155 327/108 |
| 2014/0097906 A1 | 4/2014 | Jennings et al. |

(Continued)

FOREIGN PATENT DOCUMENTS

| | | |
|---|---|---|
| CN | 114301441 A | 4/2022 |
| KR | 20100045715 A | 5/2010 |

OTHER PUBLICATIONS

International Search Report and Written Opinion—PCT/US2024/043371—ISA/EPO—Nov. 13, 2024.

*Primary Examiner* — Henry Tsai
*Assistant Examiner* — Juanito C Borromeo
(74) *Attorney, Agent, or Firm* — Loza & Loza, LLP

(57) ABSTRACT

An input buffer includes a pair of input transistors and associated injection circuits. A first input transistor has a source coupled to a first voltage rail through a first current source and a gate coupled to a first wire of a multi-wire serial bus. Three or more resistors in a first injection circuit couple the wires of the serial bus to a first common node, which is coupled to the source of the first input transistor by a first capacitor. A second input transistor has a source coupled to the first voltage rail through a second current source and a gate coupled to a second wire of the serial bus. Three or more resistors in a second injection circuit couple the wires of the multi-wire serial bus to a second common node, which is coupled to the source of the second input transistor by a second capacitor.

27 Claims, 10 Drawing Sheets

(56) References Cited

U.S. PATENT DOCUMENTS

| | | | |
|---|---|---|---|
| 2015/0200541 A1* | 7/2015 | Gorla | H02J 1/102 |
| | | | 307/80 |
| 2018/0241382 A1 | 8/2018 | Wang et al. | |
| 2023/0058759 A1 | 2/2023 | Hori et al. | |
| 2023/0087897 A1 | 3/2023 | Chou et al. | |

* cited by examiner

RADIO FREQUENCY INTERFERENCE COMMON MODE INJECTION IN A C-PHY RECEIVER

TECHNICAL FIELD

The present disclosure relates generally to serial communication over a serial bus in a wireless communication device and, more particularly, to common mode radio frequency interference in a C-PHY interface.

BACKGROUND

Mobile communication devices typically include a variety of components such as circuit boards, integrated circuit (IC) devices, application-specific integrated circuit (ASIC) devices and/or System-on-Chip (SoC) devices. The types of components may include processing circuits, user interface components, storage and other peripheral components that communicate over a serial bus. The serial bus may be operated in accordance with a standardized or proprietary protocol. In one example, the serial bus can be operated in accordance with an Inter-Integrated Circuit (I2C or I2C) communication protocol. The I2C bus is configured as a multi-drop bus and was developed to connect low-speed peripherals to a processor. The two wires of an I2C bus include a Serial Data Line (SDA) that carries a data signal, and a Serial Clock Line (SCL) that carries a clock signal.

Multiple standards are defined for interconnecting certain types of components in mobile communication devices. For example, different types of interfaces may be used for communication between an application processor and display or camera components in a mobile communication device. Some display or camera components employ an interface that conforms to standards or protocols specified by the Mobile Industry Processor Interface (MIPI) Alliance for a camera serial interface (CSI) and a display serial interface (DSI).

The MIPI Alliance DSI, DSI-2 (referred to individually or collectively herein as DSI) and CSI and CSI-2 (referred to individually or collectively herein as CSI) standards define wired interfaces that can be deployed within an IC or between some combination of IC devices and SoC devices. CSI protocols may be used to couple a camera and application processor. DSI protocols may be used to couple an application processor and display subsystem. The low-level physical-layer (PHY) interface in each of these applications can be implemented in accordance with MIPI Alliance C-PHY or D-PHY standards and protocols. High-speed modes and low-power modes of communication are defined for C-PHY and D-PHY interfaces. The C-PHY high-speed mode uses a low-voltage multiphase signal transmitted in different phases on a 3-wire link. The D-PHY high-speed mode uses multiple 2-wire lanes to carry low-voltage differential signals. The low-power modes of C-PHY and D-PHY interfaces provide lower rates than the high-speed modes and transmit signals at higher voltages.

Application processors and associated camera and display subsystems may be subjected to electromagnetic interference (EMI) from a variety of sources, including collocated radio frequency (RF) transceivers, including RF transmitter circuits and antennae. As device technology improves, a combination of demand for higher data rates over serial buses have been met in some instances by increasing the clock rates used to control signaling over serial interfaces. For example, the version 2.0 specification for MIPI C-PHY interfaces provides for transmission clock rates of between 4.5 GHZ and 6.0 GHz. Increasing transmission clock frequencies can decrease the tolerances and margins defined for data signals and can exacerbate the effects of EMI. For these and other reasons, there is an ongoing need to improve the ability of high-speed interfaces to reject EMI.

SUMMARY

Certain aspects of the disclosure relate to systems, apparatus, methods and techniques that can improve common mode noise rejection at receivers coupled to a C-PHY three-wire communication link.

In various aspects of the disclosure, an input buffer includes a pair of input transistors and associated injection circuits. A first input transistor has a source that is coupled to a first voltage rail through a first current source and a gate that is coupled to a first wire of a multi-wire serial bus. A first injection circuit includes three or more resistors configured to couple the wires of the multi-wire serial bus to a common node of the first injection circuit. The first injection circuit also includes a capacitor configured to couple the common node of the first injection circuit to the source of the first input transistor. A second input transistor has a source that is coupled to the first voltage rail through a second current source and a gate that is coupled to a second wire of the multi-wire serial bus. A second injection circuit includes three or more resistors configured to couple the wires of the multi-wire serial bus to a common node of the second injection circuit. The second injection circuit also includes a capacitor configured to couple the common node of the second injection circuit to the source of the second input transistor.

In various aspects of the disclosure, a method for buffering signals received from a multi-wire serial bus includes receiving a first signal over a first wire of a multi-wire serial bus at a gate of a first input transistor, receiving a second signal over a second wire of the multi-wire serial bus at a gate of a second input transistor and injecting common mode noise into the sources of the first input transistor and the second input transistor using a first injection circuit and a second injection circuit. The first input transistor has a source that is coupled to a first voltage rail through a first current source. The second input transistor has a source that is coupled to the first voltage rail through a second current source. The first injection circuit has a capacitor and three or more resistors. Each wire of the multi-wire serial bus is coupled to a first common node through the three or more resistors of the first injection circuit. The first common node is coupled to the source of the first input transistor through the capacitor of the first injection circuit. The second injection circuit has a capacitor and three or more resistors. Each wire of the multi-wire serial bus is coupled to a second common node through the three or more resistors of the second injection circuit. The second common node is coupled to the source of the second input transistor through the capacitor of the second injection circuit.

In various aspects of the disclosure, an apparatus includes means for buffering a first signal received over a multi-wire serial bus, means for buffering a second signal received over a multi-wire serial bus, and means for injecting common mode noise into the sources of the first input transistor and the second input transistor. The means for buffering the first signal includes a first input transistor having a gate that is coupled to a first wire of the multi-wire serial bus and a source that is coupled to a first voltage rail through a first current source. The means for buffering the second signal includes a second input transistor having a gate that is coupled to a second wire of the multi-wire serial bus and a source that is coupled to the first voltage rail through a second current source. The means for injecting the common mode noise into the sources of the first input transistor and the second input transistor includes a first injection circuit and a second injection circuit. The first injection circuit has a capacitor and three or more resistors, each wire of the multi-wire serial bus being coupled to a first common node through the three or more resistors of the first injection circuit. The first common node may be coupled to the source of the first input transistor through the capacitor of the first injection circuit. The second injection circuit may have a capacitor and three or more resistors, each wire of the multi-wire serial bus being coupled to a second common node through the three or more resistors of the second injection circuit. The second common node may be coupled to the source of the second input transistor through the capacitor of the second injection circuit.

In certain aspects, the multi-wire serial bus includes a three-wire serial bus that is operated in accordance with a Mobile Industry Processor Interface (MIPI) Alliance C-PHY protocol. The first injection circuit may include three resistors, and the first injection circuit may present a resistance to the three-wire serial bus that is at least double a characteristic impedance of the three-wire serial bus.

In certain aspects, the input buffer or apparatus has a source degeneration circuit that is configured to couple the source of the first input transistor with the source of the second input transistor. The source degeneration circuit may include a programmable resistor-capacitor network.

In certain aspects, a drain of the first input transistor is coupled to a second voltage rail through a first output resistor and a drain of the second input transistor is coupled to the second voltage rail through a second output resistor. The input buffer or apparatus may be provided in a first stage of a differential receiver circuit. The drains of the first input transistor and the second input transistor may be coupled to inputs of a second stage of the differential receiver circuit. The input buffer or apparatus may include a source degeneration circuit that couples the source of the first input transistor and the source of the second input transistor. The source degeneration circuit may be configured to control a common mode voltage measured between the drains of the first input transistor and the second input transistor.

In certain aspects, the first injection circuit and the second injection circuit are configured to pass signals generated in a three-wire serial bus by radio frequency interference and to block signals encoded in accordance with a MIPI Alliance C-PHY protocol. The input buffer or apparatus may be provided in a first differential receiver circuit. Each combination of two wires in the three-wire serial bus may be coupled to one of three differential receiver circuits.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Data communication links employed by SoCs and other IC devices to connect processors with modems and other peripherals may be operated in accordance with industry or proprietary standards or protocols associated with certain functions or types of devices. In the example of display panels, display subsystems, and display drivers, communication standards and protocols defined by the MIPI Alliance are frequently used. The Display Serial Interface (DSI®), for example, provides C-PHY and D-PHY standards and protocols used to define, configure and control a high-speed serial interface between a host processor and a display module.

According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, or any other similar functioning device.

Figure 1:
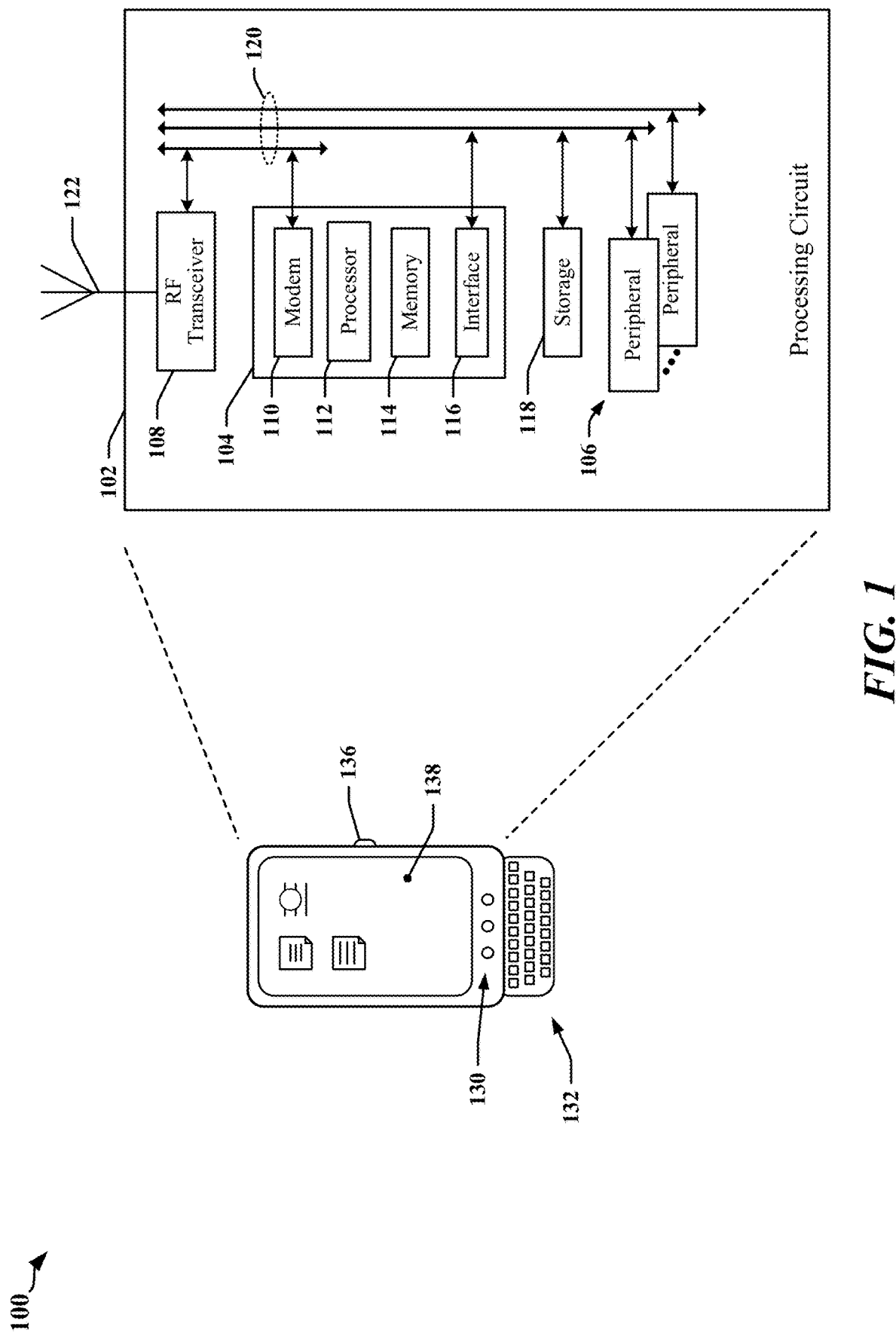
FIG. 1 illustrates an apparatus employing a data link between IC devices and that is selectively operated according to a standard or proprietary protocol.

FIG. 1 illustrates an example of an apparatus 100 that includes multiple devices or circuits coupled through one or more data communication buses. A processing circuit 102 of the apparatus 100 includes multiple circuits or devices 104, 106 and/or 108. In some examples, the processing circuit 102 is implemented using one or more ASICs. In other examples, the processing circuit 102 is implemented in an SoC. In one example, the apparatus 100 may be configured to operate as a communication device and the processing circuit 102 includes an ASIC 104, one or more peripheral devices 106, and a transceiver 108 that cooperate to enable the apparatus to communicate through an antenna 122 with a radio access network, a core access network, the Internet and/or another network.

The ASIC 104 may have one or more processors 112, one or more modems 110, on-board memory 114, a bus interface circuit 116 and/or other logic circuits or functions. The processing circuit 102 may be controlled by an operating system that provides an application programming interface (API) layer that enables the one or more processors 112 to execute software modules residing in the on-board memory 114 or other processor-readable storage 118 provided on the processing circuit 102. The software modules may include instructions and data stored in the on-board memory 114 or processor-readable storage 118. The ASIC 104 may access its on-board memory 114, the processor-readable storage 118, and/or storage external to the processing circuit 102. The on-board memory 114, the processor-readable storage 118 may include read-only memory (ROM) or random-access memory (RAM), electrically erasable programmable ROM (EEPROM), flash cards, or any memory device that can be used in processing systems and computing platforms. The processing circuit 102 may include, implement, or have access to a local database or other parameter storage that can maintain operational parameters and other information used to configure and operate the apparatus 100 and/or the processing circuit 102. The local database may be implemented using registers, a database module, flash memory, magnetic media, EEPROM, soft or hard disk, or the like. The processing circuit 102 may also be operably coupled to external devices such as the antenna 122, a display 138, operator controls, such as switches or buttons 136, 130 and/or an integrated or external keypad 132, among other components. A user interface module may be configured to operate with the display 138, external keypad 132, etc. through a dedicated communication link or through one or more serial data interconnects.

The processing circuit 102 may provide multiple buses 120 that enable communication between two or more devices 104, 106, and/or 108. In one example, the ASIC 104 may include bus interface circuits 116 coupled to one or more of the buses 120. Each of the bus interface circuits 116 may include a combination of circuits, counters, timers, control logic and other configurable circuits or modules. In one example, certain bus interface circuits 116 may be configured to operate in accordance with standards-defined communication specifications or protocols. The processing circuit 102 may include or control a power management function that configures and manages the operation of the apparatus 100.

Figure 2:
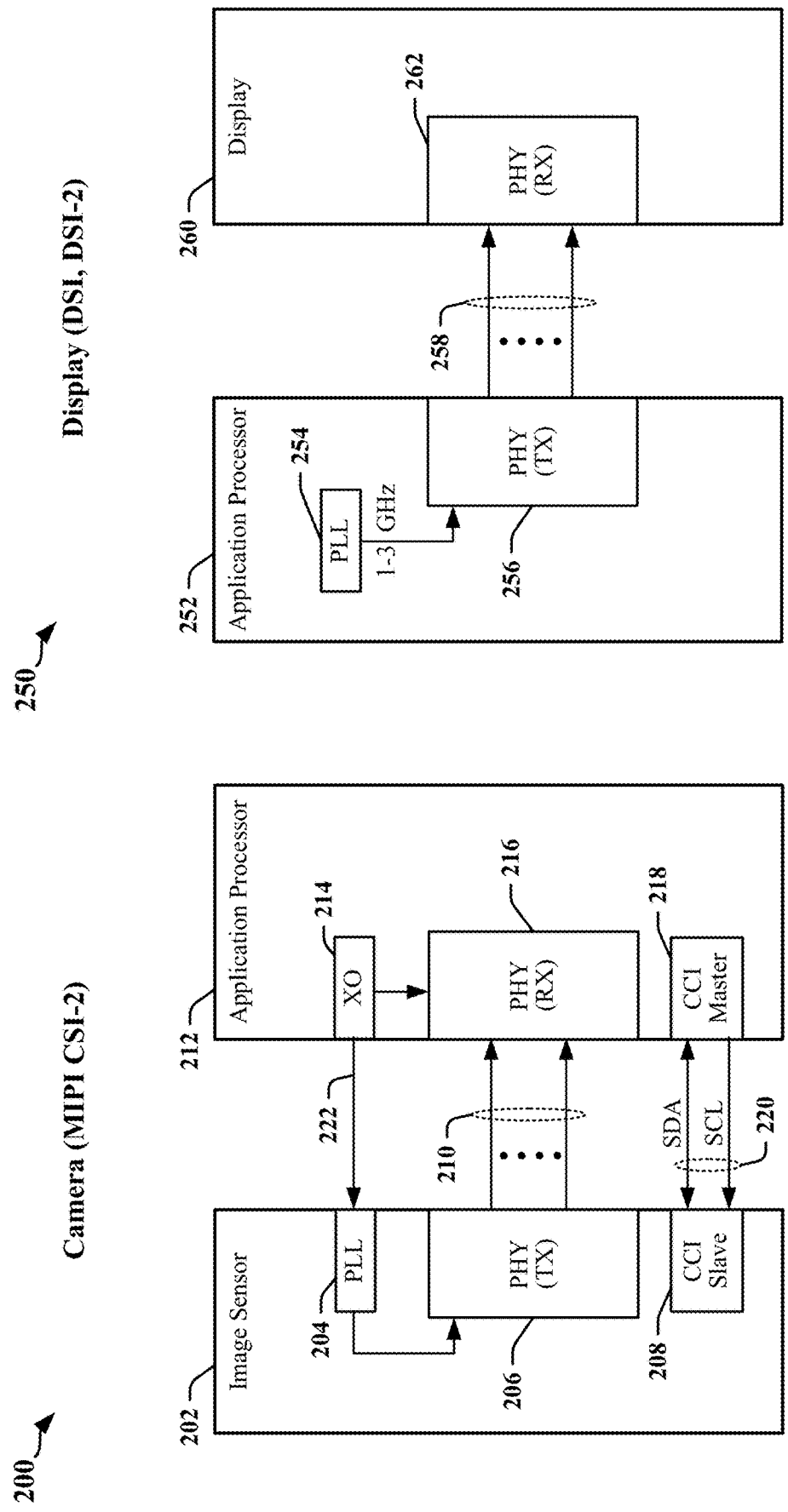
FIG. 2 illustrates examples of interface circuits that may be adapted in accordance with certain aspects of this disclosure.

FIG. 2 illustrates examples of interface circuits that may be employed or adapted in accordance with certain aspects of this disclosure. A first interface circuit is configured as a camera subsystem 200 and a second interface circuit is configured as a display subsystem 250. The interface circuits may be deployed in a mobile communication device, for example. The camera subsystem 200 may include a CSI-2 defined communication link between an image sensor 202 and an application processor 212. The communication link may include a high-data rate data transfer link 210 used by the image sensor 202 to transmit image data to the application processor 212 using a transmitter 206. The high-data rate data transfer link 210 may be configured and operated according to C-PHY protocols. The application processor 212 may include a crystal oscillator (XO 214) or other clock source to generate a clock signal 222 that controls the operation of the transmitter 206. The clock signal 222 may be processed by a phase-locked loop (PLL) 204 in the image sensor 202. In some instances, the clock signal 222 may also be used by the C-PHY receiver 216 in the application processor 212. The communication link may include a Camera Control Interface (CCI), which is similar in nature to the Inter-Integrated Circuit (I2C) interface. The CCI bus may include a Serial Clock (SCL) line that carries a clock signal and a Serial Data (SDA) line that carries data. The CCI link 220 may be bidirectional and may operate at a lower data rate than the high-data rate data transfer link 210. The CCI link 220 may be used by the application processor 212 to exchange control and configuration information with the image sensor 202. The application processor 212 may include a CCI bus master 218 and the image sensor 202 may include a CCI slave 208.

The display subsystem 250 may include a unidirectional data link 258 that can be configured and operated according to C-PHY protocols. In the application processor 252, a clock source such as the PLL 254 may be used to generate a bit clock signal used by a C-PHY receiver 256 to control transmissions on the data link 258. At the display device 260, a C-PHY receiver 262 may extract embedded clock information from sequences of symbols transmitted on the data link, or from a clock lane provided in the data link 258.

Certain aspects disclosed herein relate to systems, apparatus and methods that can operate using different physical media and that can support a broad range of interface protocols, including C-PHY protocols.

Figure 3:
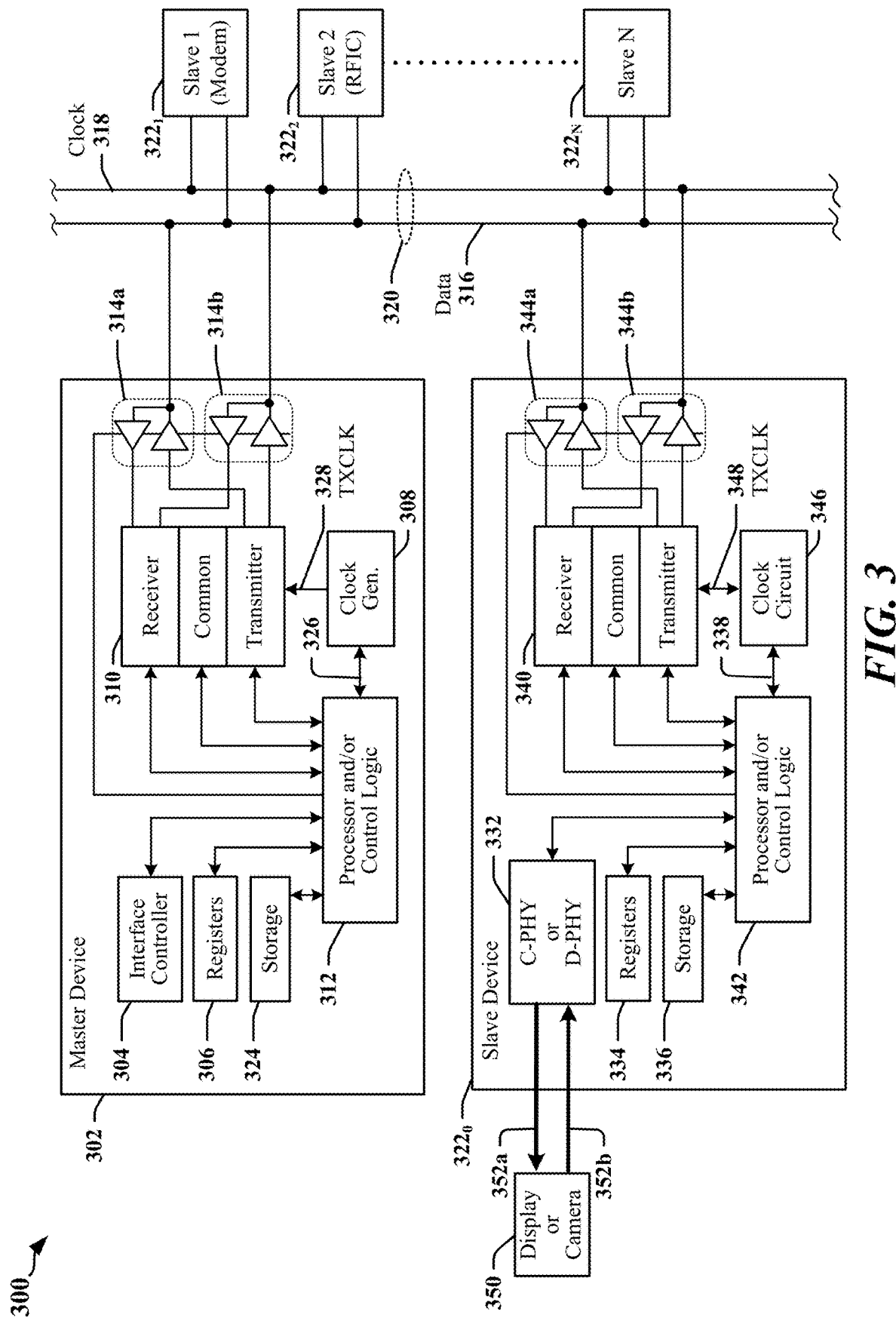
FIG. 3 illustrates a system architecture for an apparatus employing a C-PHY data link between IC devices.

FIG. 3 illustrates an example of an apparatus 300 employing a data link that may be used to communicatively couple two or more devices, subcomponents or circuits. Here, the apparatus 300 includes multiple devices 302, and $322_0$-$322_N$ coupled to a two-wire serial bus 320. The devices 302 and $322_0$-$322_N$ may be implemented in one or more semiconductor IC devices, such as an application processor, SoC or ASIC. In various implementations certain of the devices 302 and $322_0$-$322_N$ may include, support or operate as a modem, a signal processing device, a display driver, a camera, a user interface, a sensor, a sensor controller, a media player, a transceiver, and/or other such components or devices. In some examples, one or more devices $322_0$-$322_N$ may be used to control, manage or monitor a sensor device. Communication between devices 302 and $322_0$-$322_N$ over the serial bus 320 is controlled by a bus master device 302. Certain types of bus can support multiple bus masters 302.

In one example, a bus master device 302 includes an interface controller 304 that may be configured to manage access to the serial bus, configure dynamic addresses for slave devices and/or generate a clock signal 328 to be transmitted on a clock line 318 of the serial bus 320. The bus master device 302 may include configuration registers 306 or other storage 324, and other control logic 312 configured to handle protocols and/or higher-level functions. The control logic 312 may include a processing circuit such as a state machine, sequencer, signal processor or general-purpose processor. The bus master device 302 includes a transceiver 310 and line drivers/receivers 314a and 314b. The transceiver 310 may include receiver, transmitter and common circuits, where the common circuits may include timing, logic and storage circuits and/or devices. In one example, the transmitter encodes and transmits data based on timing in the clock signal 328 provided by a clock generation circuit 308. Other timing clocks 326 may be used by the control logic 312 and other functions, circuits or modules.

At least one device $322_0$-$322_N$ may be configured to operate as a slave device on the serial bus 320 and may include circuits and modules that support a display, an image sensor, and/or circuits and modules that control and communicate with one or more sensors that measure environmental conditions. In one example, a device $322_0$ configured to operate as a slave device may provide a control function, physical layer circuit 332 that includes circuits and modules to support a display, an image sensor, and/or circuits and modules that control and communicate with one or more sensors that measure environmental conditions. In this example, the device $322_0$ can include configuration registers 334 or other storage 336, control logic 342, a transceiver 340 and line drivers/receivers 344a and 344b. The control logic 342 may include a processing circuit such as a state machine, sequencer, signal processor or general-purpose processor. The transceiver 340 may include receiver, transmitter and common circuits, where the common circuits may include timing, logic and storage circuits and/or devices. In one example, the transmitter encodes and transmits data based on timing in a clock signal 348 provided by clock generation and/or recovery circuits 346. In some instances, the clock signal 348 may be derived from a signal received from the clock line 318. Other timing clocks 338 may be used by the control logic 342 and other functions, circuits or modules.

The serial bus 320 may be operated in accordance with standards defined protocol or proprietary protocol. In some instances, two or more devices 302, $322_0$-$322_N$ may be configured to operate as a bus master device on the serial bus 320. In some instances, the apparatus 300 includes multiple serial buses 320, 352a and/or 352b that couple two or more of the devices 302, $322_0$-$322_N$ or one of the devices 302, $322_0$-$322_N$ and a peripheral device such as a display or camera 350 or a Radio-Frequency IC (RFIC). In some examples, one slave device $322_0$ is configured to operate as a display or camera coupled to a display or camera 350. The latter slave device $322_0$ may include a physical layer circuit 332 that is configured to operate as a C-PHY interface controller that communicates with the display or camera 350 over a serial bus 352a or 352b operated in accordance with a C-PHY protocol.

In certain aspects of this disclosure, systems and apparatus may employ multi-phase data encoding and decoding interface methods for communicating between IC devices. A multi-phase encoder may drive a plurality of conductors (i.e., 3 conductors). Each conductor may be referred to as a wire, although the conductors may include conductive traces on a circuit board or traces or interconnects within a conductive layer of a semiconductor IC device. In one example, a physical layer interface implemented using MIPI Alliance-defined C-PHY technology and protocols (i.e., a C-PHY interface) may be used to connect camera or display to an application processor. The C-PHY interface employs three-phase symbol encoding to transmit data symbols on 3-wire lanes, or "trios" where each trio includes an embedded clock. A symbol interval may be defined as the interval of time in which a single three-phase symbol controls the signaling state of a trio. A trio may be referred to as a lane herein. A multi-lane C-PHY communication channel may be established using multiple trios to carry data exchanged between a pair of devices, where each channel includes one trio that carries a portion of the data, which may be independently encoded in accordance with C-PHY protocols.

The C-PHY interface provides a three-phase encoding scheme for a three-wire system. The three-phase encoding scheme defines three phase states and two polarities, providing 6 states and 5 possible transitions from each state. Deterministic voltage and/or current changes may be detected and decoded to extract data from the three wires.

Figure 4:
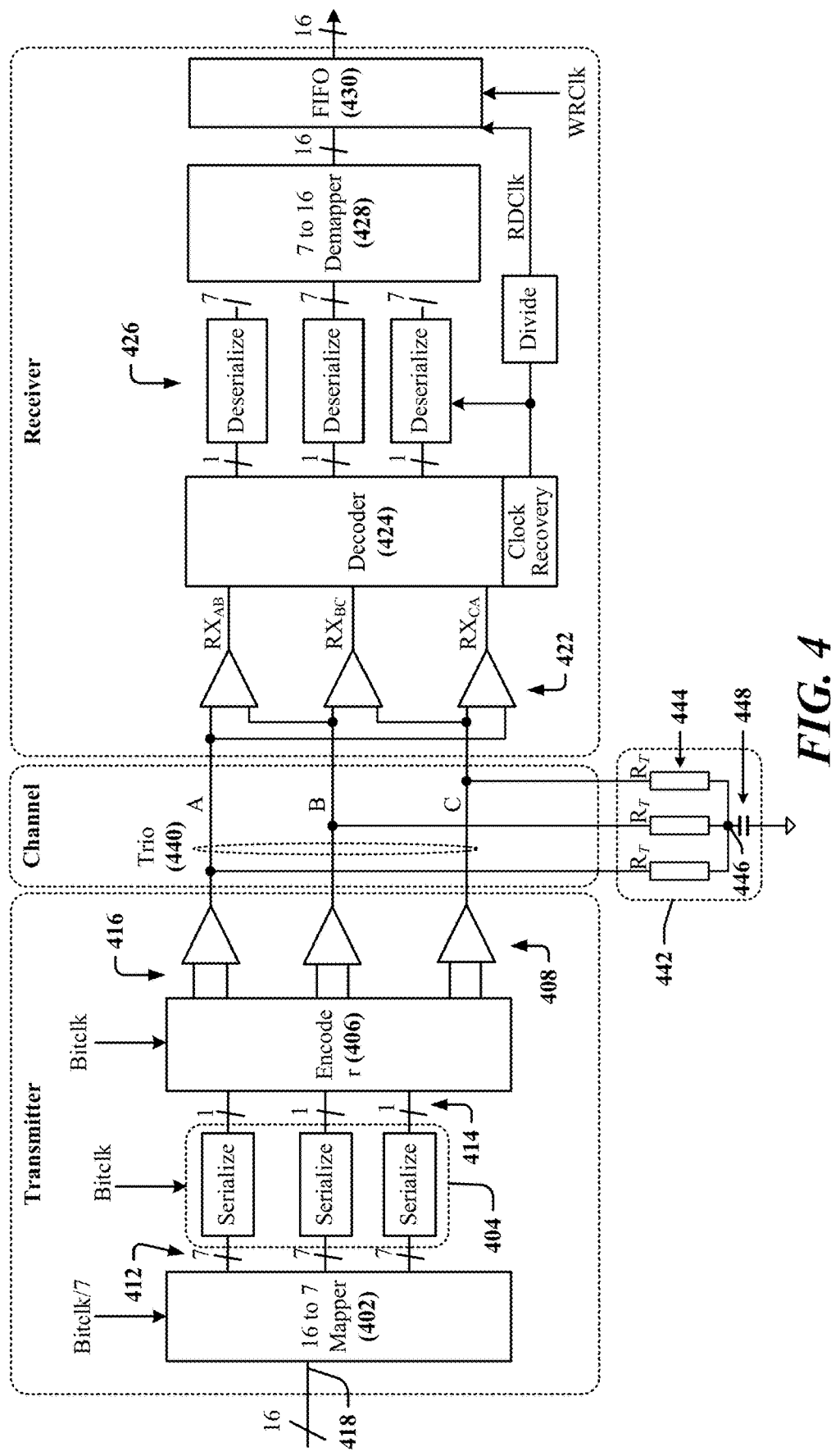
FIG. 4 illustrates an example of a C-PHY interface that may be adapted according to certain aspects disclosed herein.

FIG. 4 illustrates an example of a C-PHY interface that may be used to implement certain aspects of the serial bus 352a or 352b depicted in FIG. 3. The illustrated example may relate to a three-wire link configured to carry 3-phase polarity encoded differential signals. Differential signaling can effectively common mode rejection of electromagnetic interference. The use of 3-phase polarity encoding provides for high-speed data transfer and may consume half or less of the power of other interfaces at the desired operating frequency because fewer than 3 drivers are active at any time in a C-PHY link. The C-PHY interface uses 3-phase polarity encoding to encode multiple bits per symbol transition on the three-wire link. In one example, a combination of three-phase encoding and polarity encoding may be used to support a wide video graphics array (WVGA), 80 frames per second liquid crystal display driver IC without a frame buffer, delivering pixel data for display refresh at 810 Mbps over three or more wires.

In the depicted C-PHY interface, three-phase polarity encoding is used to control signaling state of connectors, wires, traces and other interconnects that provide a channel for communication. In the illustrated example, a single unidirectional channel, or lane, is provided using a combination of three wires (the trio 440). A termination network 442 may be coupled to the trio 440 at the receiving end of the channel. In the illustrated example, the termination network 442 includes three termination resistors 444. Each of the termination resistors 444 couples a respective wire in the trio 440 to a common node 446 in the termination network 442. In some implementations, the common node 446 is further coupled to system ground through a capacitor 448. In other implementations, the common node 446 may be coupled to a rail of a power supply through the capacitor 448. The nominal resistance value (RT) of the termination resistors 444 may be configured or selected to match the characteristic impedance of a wire in the trio 440. Certain specifications for the C-PHY interface define a nominal 50 Ohm (50Ω) characteristic impedance for each wire in the trio 440 and a nominal differential impedance of 100 Ω for each pair of wires in the in the trio 440. The differential impedance may relate to a combination of two wires in the trio 440.

Each wire in the trio 440 may be undriven, driven positive, or driven negative in any symbol transmission interval. In some instances, an undriven signal wire of the trio 440 may be in a high-impedance state. In some instances, an undriven signal wire of the trio 440 may be driven or pulled to a voltage level that lies substantially halfway between the positive and negative voltage levels provided on driven signal wires. In some instances, an undriven signal wire of the trio 440 may have no current flowing through it. Drivers 408 in the C-PHY transmitter 400 coupled to the signal wires of the trio 440 are controlled such that only one wire of the trio 440 is in each of three states (denoted as +1, −1, or 0) in each symbol interval.

In one example, the drivers 408 include unit-level current-mode drivers. In another example, the drivers 408 drive opposite polarity voltages on two signals transmitted on two signal wires of the trio 440 while the third signal wire is at high impedance and/or pulled to ground. For each transmitted symbol interval, at least one signal is in the undriven (0) state, while one signal is driven to the positive (+1 state) and one signal is driven to the negative (−1 state), such that the sum of current flowing to the C-PHY receiver 420 is zero amperes. For each symbol, the state of at least one signal wire of the trio 440 is changed from the symbol transmitted in the preceding transmission interval.

In the C-PHY transmitter 400, a mapper 402 may receive a 16-bit input data word 418, and the mapper 402 may map the input data word 418 to 7 symbols 412 for transmitting sequentially over the signal wires of the trio 440. A 3-phase polarity encoder 406 may receive the 7 symbols 412 produced by the mapper, one input symbol 414 at a time, and computes the state of each signal wire of the trio 440 for each symbol interval, based on the immediately preceding state of the signal wires of the trio 440. The 7 symbols 412 may be serialized using parallel-to-serial converters 404, for example. The 3-phase polarity encoder 406 provides control signals 416 to define the outputs of the drivers 408. The 3-phase polarity encoder 406 selects the states of the signal wires of the trio 440 based on the input symbol 414 and the previous states of signal wires of the trio 440 and may provide control signals 416 to cause the drivers 408 to produce the desired signaling state on the trio 440.

The use of three-wire, three-phase encoding permits several bits to be encoded in a plurality of symbols where the bits per symbol is not an integer. In the example of a three-wire, three-phase system, there are 3 available combinations of 2 wires, which may be driven simultaneously, and 2 possible combinations of polarity on the simultaneously driven pair of wires, yielding 6 possible states. Since each transition occurs from a current state, 5 of the 6 states are available at every transition. With 5 states, $\log_2(5) \cong 2.32$ bits may be encoded per symbol transition. Accordingly, a mapper may accept a 16-bit word and convert it to a 7-symbol sequence because 7 symbols carrying 2.32 bits per symbol can encode 16.24 bits. In other words, a combination of seven symbols that encodes five states has $5^7$ (78,125) permutations. Accordingly, the 7 symbols may be used to encode the $2^{16}$ (65,536) permutations of 16 bits.

In the illustrated example, the C-PHY receiver 420 includes comparators 422 that are configured to provide raw symbols, which are digital representations of the state of each of three signal wires of the trio 440, and a decoder 424 that produces a decoded symbol that represents the change in the state of the three signal wires compared to the state transmitted in the previous symbol period. Seven decoded symbols are assembled by serial-to-parallel convertors 426 and used to produce a set of 7 symbols to be processed by a demapper 428 to obtain 16 bits of data that may be buffered in a first-in-first-out (FIFO) storage device 430, which may be implemented using registers, for example.

Figure 5:
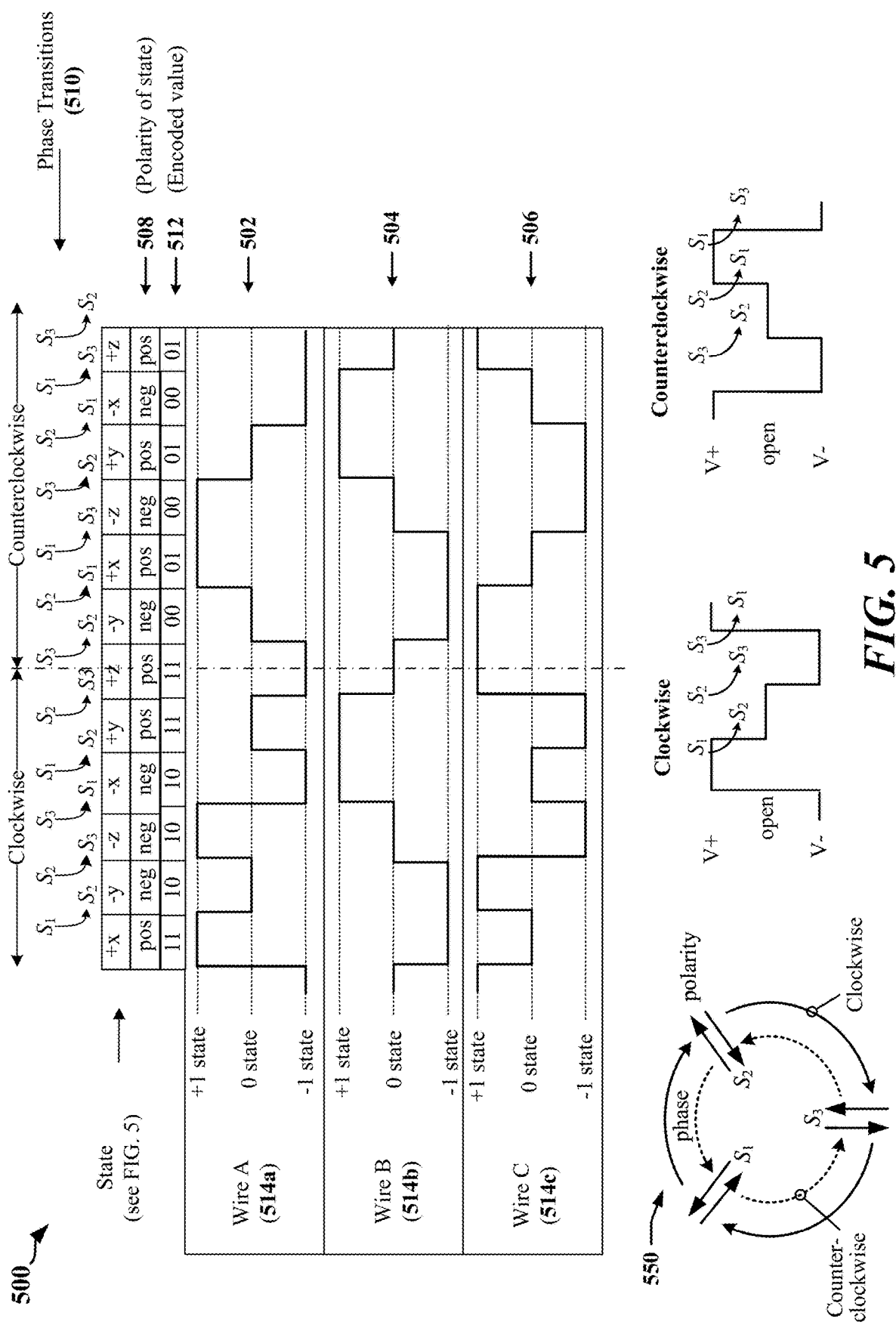
FIG. 5 illustrates signaling in an example of an N-phase polarity encoded interface.

FIG. 5 illustrates an example of signaling 500 employing a 3-phase modulation data-encoding scheme based on the circular state transition diagram 550. According to the data-encoding scheme, the phase of a 3-phase signal may rotate in two directions and may be transmitted on three wires 514a, 514b and 514c, identified as connectors A, B, and C. Each of the three signals is independently driven on the wires 514a, 514b, 514c. Each of the three signals includes the 3-phase signal, with each signal being 120 degrees out of phase relative to the other two signals. At any point in time, each of the three wires 514a, 514b, 514c is in a different one of the states {+1, 0, −1}. At any point in time, each of the three wires 514a, 514b, 514c in a 3-wire system is in a different state than the other two wires. When more than three conductors or wires are used, two or more pairs of wires may be in the same state. The illustrated encoding scheme may also encode information in the polarity of the two wires 514a, 514b and/or 514c that are actively driven to the +1 and −1 states. Polarity is indicated at 508 for the sequence of states depicted.

At any phase state in the illustrated 3-wire example, exactly two of the wires 514a, 514b, 514c carry a signal which is effectively a differential signal for that phase state, while the third wire 514a, 514b or 514c is undriven. The phase state for each wire 514a, 514b, 514c may be determined by voltage difference between the wire 514a, 514b or 514c and at least one other wire 514a, 514b and/or 514c, or by the direction of current flow, or lack of current flow, in the wire 514a, 514b or 514c. As shown in the state transition diagram 550, three phase states ($S_1$, $S_2$ and $S_3$) are defined. A signal may flow clockwise from phase state $S_1$ to phase state $S_2$, phase state $S_2$ to phase state $S_3$, and/or phase state $S_3$ to phase state $S_1$ and the signal may flow counterclockwise from phase state $S_1$ to phase state $S_3$, phase state $S_3$ to phase state $S_2$, and/or phase state $S_2$ to phase state $S_1$. For other values of N, transitions between the N states may optionally be defined according to a corresponding state diagram to obtain circular phase rotation between state transitions.

In the example of a 3-wire, 3-phase communication link, clockwise phase rotations ($S_1$ to $S_2$), ($S_2$ to $S_3$), and/or ($S_3$ to $S_1$) at a phase transition 510 (between states) may be used to encode a logic 1, while counterclockwise phase rotations ($S_1$ to $S_3$), ($S_3$ to $S_2$), and/or ($S_2$ to $S_1$) at the phase transition 510 may be used to encode a logic 0. Accordingly, a bit may be encoded at each transition by controlling whether the phase of the signal is "rotating" clockwise or counterclockwise. For example, a logic 1 may be encoded when the three wires 514a, 514b, 514c transition from phase state $S_1$ to phase state $S_2$ and a logic 0 may be encoded when the three wires 514a, 514b, 514c transition from phase state $S_1$ to phase state $S_3$. In the 3-wire example depicted, direction of phase rotation may be easily determined based on which of the three wires 514a, 514b, 514c is undriven before and after the transition.

Information may also be encoded in the polarity and/or changes of polarity of state 508 of the driven wires 514a, 514b, 514c, or in the direction of current flow or changes in the direction of current flow between two wires 514a, 514b, 514c. Signals 502, 504, and 506 illustrate voltage levels applied to wires 514a, 514b, 514c, respectively at each phase state in a 3-wire, 3-phase link. At any time, a first wire 514a, 514b, 514c is coupled to a more positive voltage (+V, for example), a second wire 514a, 514b, 514c is coupled to a more negative voltage (−V, for example), while the third wire 514a, 514b, 514c may be open-circuited. As such, one polarity encoding state may be determined by the current flow between the first and second wires 514a, 514b, 514c or the voltage polarities of the first and second wires 514a, 514b, 514c. In some embodiments, two bits of data 512 may be encoded in each phase transition 510. A decoder may determine the direction of signal phase rotation to obtain the first bit. The second bit may be determined based on the polarity difference between two of the signals 502, 504 and 506. In some instances, the second bit may be determined based on a change or lack of change in polarity of the differential signal transmitted on a pair of the wires 514a, 514b, 514c. The decoder having determined direction of phase rotation can determine the phase state and the polarity of the voltage applied between the two active wires 514a, 514b and/or 514c, or the direction of current flow through the two active wires 514a, 514b and/or 514c.

In the example of the 3-wire, 3-phase link described herein, one bit of data may be encoded in the phase rotation, or phase change in the 3-wire, 3-phase link, and an additional bit may be encoded in the polarity or changes in polarity of two driven wires. In certain embodiments, more than two bits can be encoded in each transition of a 3-wire, 3-phase encoding system by allowing transition to any of the possible states from a current state. Given three rotational phases and two polarities for each phase, 6 states are defined, such that 5 states are available from any current state. Accordingly, there may be $\log_2(5) \cong 2.32$ bits per symbol (transition) and the mapper may accept a 16-bit word and convert it to 7 symbols.

Figure 6:
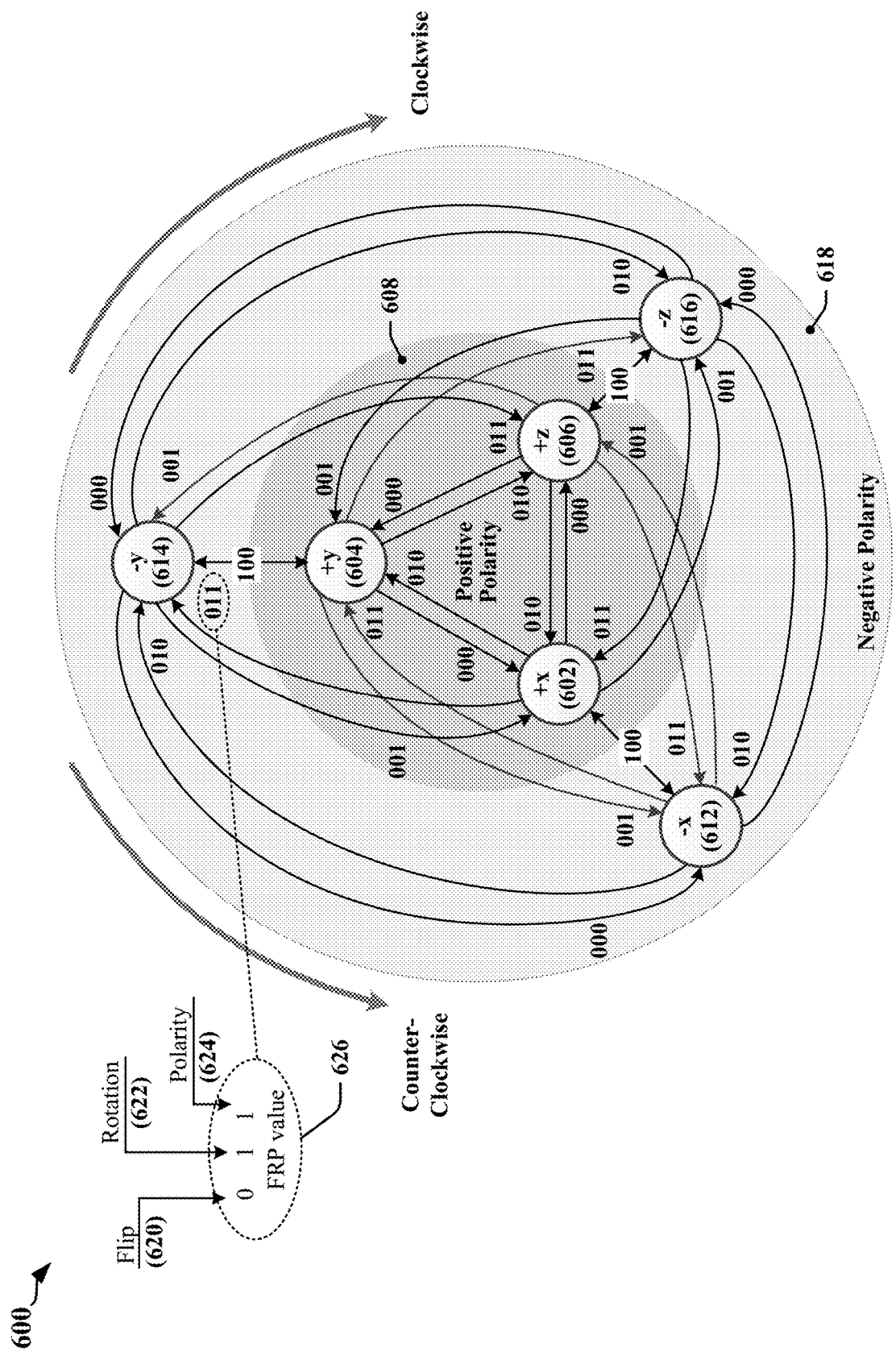
FIG. 6 is state diagram illustrating signaling states and transitions between signaling states in a C-PHY interface implemented in accordance with certain aspects disclosed herein.

FIG. 6 is a state transition diagram 600 illustrating the possible signaling states 602, 604, 606, 612, 614, 616 of the three wires in a 3-wire, 3-phase interface, including in a MIPI Alliance C-PHY high-speed mode interface for example. All possible transitions from each signaling state 602, 604, 606, 612, 614, 616 are illustrated. The transitions in the state transition diagram 600 can be represented by a Flip, Rotate, Polarity (FRP) symbol 626 that has one of the three-bit binary values in the set: {000, 001, 010, 011, 100}. The Rotate bit 622 of the FRP symbol 626 indicates the direction of phase rotation associated with a transition to a next state. The Polarity bit 624 of the FRP symbol 626 is set to binary 1 when a transition to a next state involves a change in polarity. When the Flip bit 620 of the FRP symbol 626 is set to binary 1, the Rotate and Polarity values may be ignored and/or zeroed. A flip represents a state transition that involves only a change in polarity. Accordingly, the phase of a 3-phase signal is not considered to be rotating when a flip occurs and the polarity bit is redundant when a flip occurs. The FRP symbol 626 corresponds to wire state changes for each transition. The state transition diagram 600 may be separated into an inner circle 608 that includes the positive polarity signaling states 602, 604, 606 and an outer circle 618 that encompasses the negative polarity signaling states 612, 614, 616.

The performance and operability of a C-PHY interface may be limited by the presence of electromagnetic interference (EMI). With continued reference to FIGS. 4 and 5, the use of three-phase encoding scheme to modulate signals transmitted over a trio 440 can provide significant immunity from EMI. Each of the differential receivers 422 can be expected to ignore voltages or currents induced by EMI when each input of the differential receiver 422 is affected equally by the EMI. The differential receivers 422 in the C-PHY interface illustrated in FIG. 4 generate raw symbols that are digital representations of the state of each of three signal wires of the trio 440. The wires of the trio 440 may be identified as the set of wires {A, B, C}. At a C-PHY receiver, each of three differential receivers 422 compares the signaling state of two wires in the trio 440 by subtraction (viz: A-B, B-C or C-A) and consequently can cancel in-phase voltages or currents induced by EMI when the EMI-induced voltages or currents have substantially the same magnitude.

Elimination of EMI-induced voltages or currents by subtraction may be referred to as common mode rejection. Under ideal circumstances, the three wires in the trio are routed in close proximity to one another, such that it can be expected that each wire is affected to the same extent by the EMI. However, differences in impedance of the wires of the trio 440 or within the differential receivers 422 can result in EMI-induced voltages or currents that have different magnitudes. Physical separation of two or more wires of the trio 440 along the route of the trio 440 or circuit path delays within the differential receivers 422 can result in EMI-induced voltages or currents that have phase differences. In these examples, the EMI-induced voltages or currents may not be completely cancelled by the differential receivers 422. In certain implementations, the differential receivers 422 may be unable to completely cancel high-amplitude common mode noise injected into the trio 440 by RF sources such as a proximately located WiFi or 5G antenna.

Figure 7:
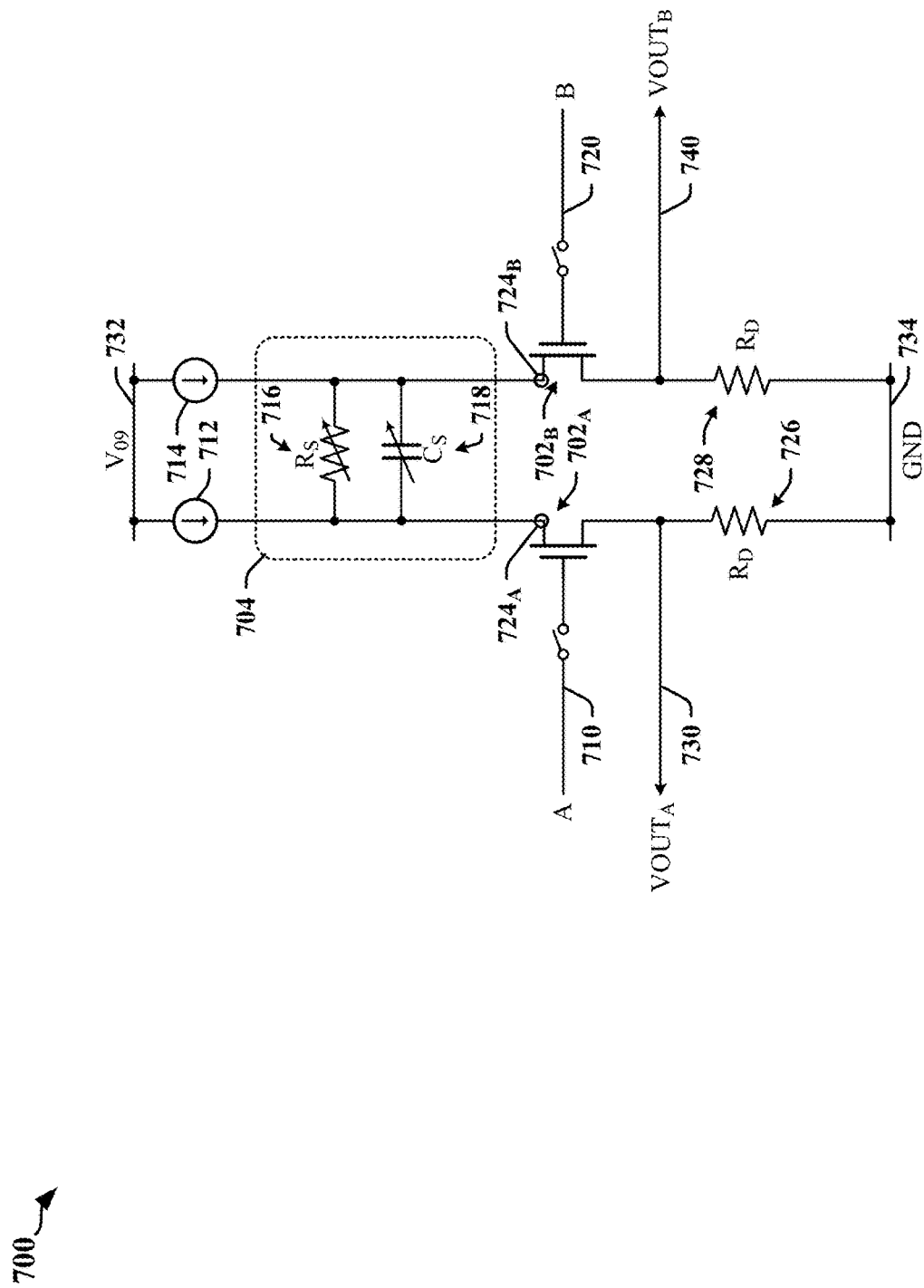
FIG. 7 illustrates a first example of an input buffer that may be adapted in accordance with certain aspects of this disclosure.

FIG. 7 illustrates an example of an input buffer 700 that implements the first stage of a differential receiver provided in a C-PHY receiver. The differential receiver may be configured to operate as an equalizing differential receiver. In certain implementations, the input buffer 700 includes a pair of input transistors $702_A$, $702_B$, and the gates of the input transistors $702_A$, $702_B$ are coupled to two wires 710, 720 of a three-wire serial bus that is operated in accordance with C-PHY protocols. In the illustrated example, the input transistors $702_A$, $702_B$ are coupled to the wires designated as the A and B wires. The sources of the two input transistors $702_A$, $702_B$ are coupled to an upper voltage rail 732 through respective tail current sources 712, 714. The drains of the two input transistors $702_A$, $702_B$ are coupled to a lower voltage rail 734 through respective load resistors 726, 728. The load resistors 726, 728 may be implemented as resistive devices. Input transistor $702_A$ drives a first output 730 ($VOUT_A$) of the input buffer 700, and input transistor $702_B$ drives a second output 740 ($VOUT_B$) of the input buffer 700.

In the illustrated example, the input buffer 700 includes a source degeneration circuit 704 and may be configured to support or facilitate continuous time linear equalization (CTLE). The source degeneration circuit 704 is coupled between sources of the pair of input transistors $702_A$, $702_B$. The source degeneration circuit 704 circuits may be configured to enable the input buffer 700 to provide a constant output direct current (DC) common mode voltage for subsequent stages of the differential receiver. In one example, the input buffer 700 may be designed or configured to provide outputs with a nominal common mode DC voltage of 230 mV to ensure reliable operation of other stages in the input buffer 700. C-PHY specifications support a wide input common mode input range of approximately 90 mV to 395 mV.

The source degeneration circuit 704 includes a source degeneration resistor 716 (generally a resistive device) coupled in parallel with a source degeneration capacitor 718 (generally a capacitive device). The value of the source degeneration resistor 716 and/or the source degeneration capacitor 718 may be configured based on application needs or expected operational conditions. The source degeneration resistor 716 and/or the source degeneration capacitor 718 may be tuned or configured by a state machine or controller to define certain filtering characteristics of the input buffer 700. For example, increasing the value of the source degeneration resistor 716 may lower DC gain through the input buffer 700.

The input buffer 700 may be unable to completely cancel high-amplitude common mode noise due to low signal-to-noise SNR loss ratios. The input buffer 700 may also be unable to completely cancel high-amplitude common mode noise due to the pseudo-differential structure of the C-PHY receiver in which none of the three differential receivers in the C-PHY receiver compares all three wires of the trio 440. The differential receivers cooperate to compare all possible pairs of the signals transmitted over the trio (A-B, B-C and C-A). The output common mode voltage level measured at the drains of the input transistors $702_A$, $702_B$ tends to vary with respect to the high-amplitude common mode noise injected at the gate.

Figure 8:
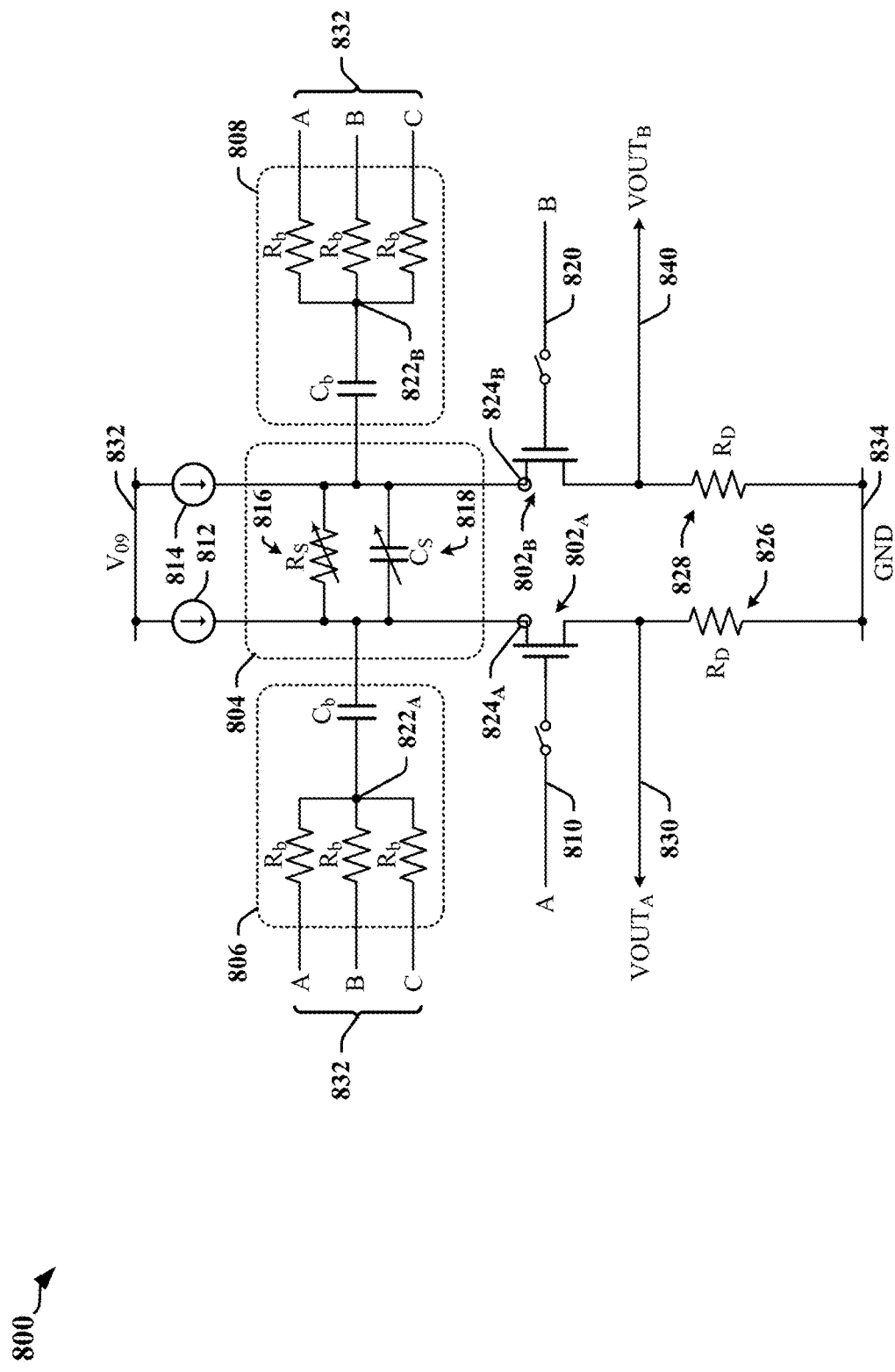
FIG. 8 illustrates a second example of an input buffer that is configured in accordance with certain aspects of this disclosure.

Certain aspects of this disclosure relate to improving common mode noise rejection in a C-PHY receiver circuit. FIG. 8 illustrates an example of an input buffer 800 that can be configured in accordance with certain aspects of this disclosure to subtract common mode noise from signals received by a differential receiver in a C-PHY interface circuit. The input buffer 800 may implement the first stage of a differential receiver provided in a C-PHY receiver.

The differential receiver may be configured to operate as an equalizing differential receiver. In certain implementations, the input buffer 800 includes a pair of input transistors $802_A$, $802_B$, and the gates of the input transistors $802_A$, $802_B$ are coupled to two wires 810, 820 of a three-wire serial bus that is operated in accordance with C-PHY protocols. In the illustrated example, the input transistors $802_A$, $802_B$ are coupled to the wires designated as the A and B wires. The sources of the two input transistors $802_A$, $802_B$ are coupled to an upper voltage rail 832 through respective tail current sources 812, 814. The drains of the two input transistors $802_A$, $802_B$ are coupled to a lower voltage rail 834 through respective load resistors 826, 828. The load resistors 826, 828 may be implemented as resistive devices. Input transistor $802_A$ drives a first output 830 ($VOUT_A$) of the input buffer 800, and input transistor $802_B$ drives a second output 840 ($VOUT_B$) of the input buffer 800.

In the illustrated example, the input buffer 800 includes a source degeneration circuit 804 and may be configured to support or facilitate continuous time linear equalization (CTLE). The source degeneration circuit 804 is coupled between sources $824_A$, $824_B$ of the pair of input transistors $802_A$, $802_B$. The source degeneration circuit 804 may be configured to control and stabilize the output DC common mode voltage of the outputs 830, 840 ($VOUT_A$ and $VOUT_B$), which may be measured at the drains of the input transistors $802_A$, $802_B$. In one example, the input buffer 800 may be designed or configured to provide outputs with a nominal common mode DC voltage of 230 mV in order to ensure reliable operation of subsequent stages of the differential receiver, including one or more equalizing stages in some implementations. The source degeneration circuit 804 includes a source degeneration resistor 816 (generally a resistive device) coupled in parallel with a source degeneration capacitor 818 (generally a capacitive device). The value of the source degeneration resistor 816 and/or the source degeneration capacitor 818 may be configured based on application needs or expected operational conditions. The source degeneration resistor 816 and/or the source degeneration capacitor 818 may be tuned or configured by a state machine or controller to define certain filtering characteristics of the input buffer 800. For example, increasing the value of the source degeneration resistor 816 may lower DC gain through the input buffer 800. In some implementations, the source degeneration circuit 804 may be omitted. For example, the source degeneration circuit 804 may be omitted when the differential receiver is configured for decision feedback equalization.

According to certain aspects of this disclosure, the input buffer 800 can be configured to enhance common mode noise rejection in a C-PHY interface. In the illustrated example, common mode noise may be extracted from the three wires of the C-PHY trio and injected into the sources $824_A$, $824_B$ of input transistors $802_A$, $802_B$ provided in the input buffer 800. The outputs 830, 840 of the input buffer 800 may be provided to a next stage of the differential receiver. In some examples, the outputs 830, 840 of the input buffer 800 are provided as inputs to an equalizer stage of the differential receiver. Injection circuits 806, 808 may be configured to offset certain effects of high-amplitude common mode noise affecting the input signals and to stabilize the output common mode voltage level measured at the drains of the input transistors $802_A$, $802_B$. Each injection circuit 806, 808 may be configured to extract common mode noise from the C-PHY trio using a network that includes three resistors and a capacitor. Each wire of the C-PHY trio is coupled to one terminal of a corresponding resistor in each injection circuit 806, 808. The other terminal of the resistors in each injection circuit 806, 808 is coupled through a common node $822_A$ or $822_B$ to a first terminal of the capacitor in the corresponding injection circuit 806, 808. The other end of the capacitor is coupled to the source $824_A$ or $824_B$ of an input transistor $802_A$ or $802_B$.

Nominally, the currents generated by the three C-PHY signals transmitted over the trio are summed at the common node $822_A$ or $822_B$, resulting in no net current flow to or from the source $824_A$ or $824_B$ of the corresponding input transistor $802_A$ or $802_B$. Common mode noise is expected to have a substantially similar effect on all three wires of the C-PHY trio and currents induced by EMI in the C-PHY trio are constructively summed at the common node $822_A$ or $822_B$, producing a net current flow to or from the source $824_A$ or $824_B$ of the corresponding input transistor $802_A$ or $802_B$. The resulting common mode noise that is injected into the sources $824_A$, $824_B$ of the input transistors $802_A$, $802_B$ tends to offset and/or cancel the common mode noise signal received at the gates of the two input transistors $802_A$, $802_B$.

The resistance ($R_b$) of the resistors and the capacitance ($C_b$) of the capacitor may be selected to maximize the cancellation of common mode noise and thereby minimize the effect of the common mode noise on the outputs 830, 840 of the input buffer 800. The value of $R_b$ can be significantly greater than the characteristic impedance of the wires in the C-PHY trio since the sum of the common mode noise of each wire produces a common mode noise signal at the common node $822_A$ or $822_B$ with an amplitude that is nominally triple the amplitude of the common mode noise signal in each wire of the C-PHY trio. The resistance ($R_b$) of the resistors and the capacitance ($C_b$) of the capacitor may be selected to pass common mode noise affecting the trio without degrading the termination of the C-PHY trio and without significantly distorting or attenuating C-PHY signaling received at the inputs of the differential receiver.

The first injection circuit may be configured with resistances or termination impedances that are multiples of the characteristic impedance of each wire in the three-wire serial bus or the differential impedance of each pair of wires in the three-wire serial bus. In certain implementations, the first injection circuit may be configured with resistances or termination impedances that are at least five times greater than the characteristic impedance of each wire in the three-wire serial bus or the differential impedance of each pair of wires in the three-wire serial bus. In certain implementations, the first injection circuit may be configured with resistances or termination impedances that are at least an order of magnitude greater than the characteristic impedance of each wire in the three-wire serial bus or the differential impedance of each pair of wires in the three-wire serial bus.

In one example, the resistors of the injection circuits 806, 808 provide a resistance $R_b$=200Ω and the capacitors in the injection circuits 806, 808 have a capacitance $C_b$=4 pF. In another example, the resistors of the injection circuits 806, 808 provide a resistance ($R_b$) of 500Ω and the capacitors in the injection circuits 806, 808 have a capacitance ($C_b$) of 1 pF. The resistance value of $R_b$ and capacitance value of $C_b$ may be selected or adjusted to enable the input buffer 800 to nominally match the characteristic impedance of each wire of the C-PHY trio and/or to nominally match the differential impedance of each pair of wires in the C-PHY trio.

In the illustrated input buffer 800, the input transistors $802_A$, $802_B$ can be implemented using P-type metal-oxide-semiconductor (PMOS) transistors devices. It should be appreciated, however, that the concepts illustrated in FIG. 8 apply equally when the input transistors $802_A$, $802_B$ are implemented using N-type metal-oxide-semiconductor (NMOS) transistors devices. When NMOS transistors devices are used, the input buffer may be reconfigured to ensure that source and drain terminals are connected appropriately. For example, a reconfiguration of the input buffer for NMOS transistors devices may include swapping the voltage rails 832 and 834 and reversing the polarity of the tail current sources 812, 814.

Figure 9:
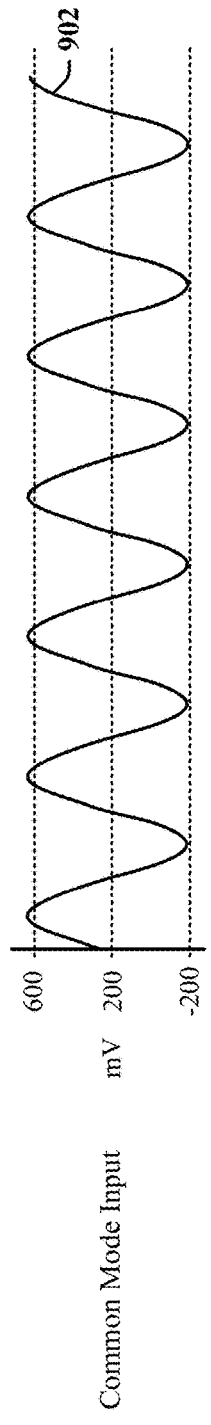
FIG. 9 illustrates certain effects of common mode noise injection into the sources of input transistors of an input buffer that is configured in accordance with certain aspects of this disclosure.
Figure 9:
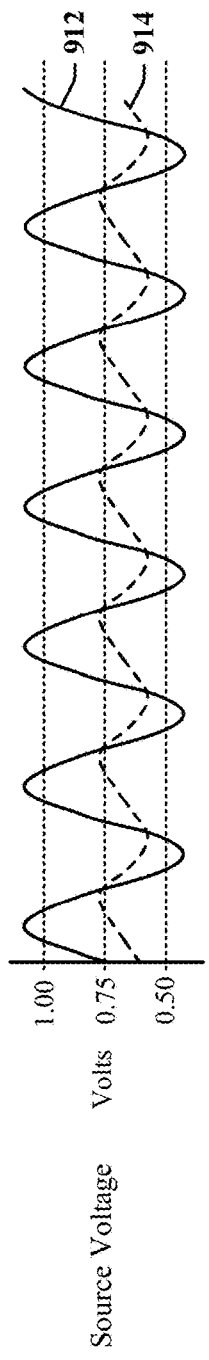
Figure 9:
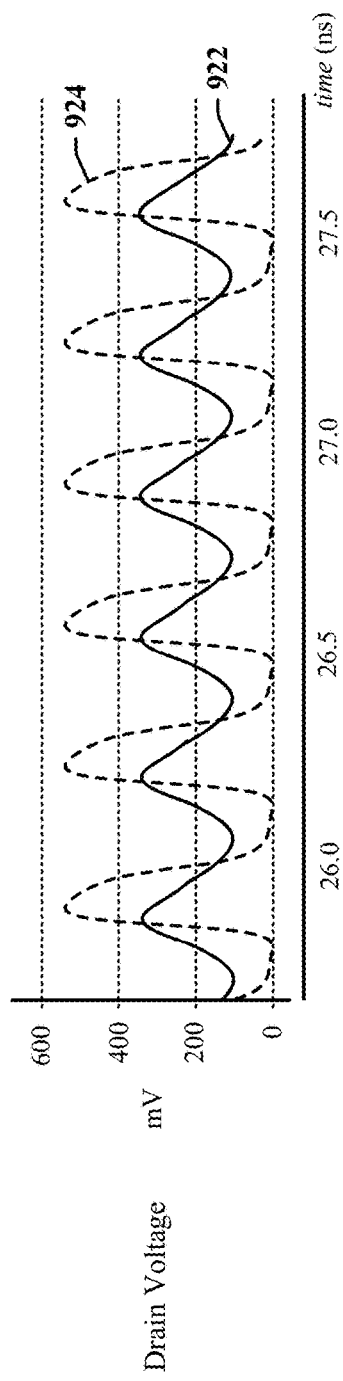

FIG. 9 illustrates the effect of the common mode noise injection into the sources $824_A$, $824_B$ of input transistors $802_A$, $802_B$. In the illustrated example, the three wires in a C-PHY trio (A, B and C) are shorted and coupled to a substantially sinusoidal test signal 902 that has a peak-to-peak amplitude of 800 mV and that has a frequency of 3 GHz. The first graph 900 shows the sinusoidal test signal 902 transmitted over the C-PHY trio. The C-PHY trio is coupled to the input buffer 800, which includes injection circuits 806, 808 that are configured in accordance with certain aspects of this disclosure. In the illustrated example, symbols may be transmitted over the C-PHY trio at a rate of 3 giga Symbols per second (3 Gsps), the resistors of the injection circuits 806, 808 provide a resistance $R_b$=200Ω and the capacitors in the injection circuits 806, 808 have a capacitance $C_b$=4 pF. In another example, symbols may be transmitted over the C-PHY trio at a rate of 3 Gsps, the resistors of the injection circuits 806, 808 provide a resistance $R_b$=500Ω and the capacitors in the injection circuits 806, 808 have a capacitance $C_b$=1 pF. For the purposes of comparison, the C-PHY trio is also coupled to the input buffer 700 illustrated in FIG. 7, which does not provide common mode noise injection.

The second graph 910 shows that the signal 912 observed at the sources $824_A$, $824_B$ of the input transistors $802_A$, $802_B$ and the signal 914 observed at the sources $724_A$, $724_B$ of the input transistors $702_A$, $702_B$. As shown in the third graph 920, the sinusoidal test signal 902 is coupled to the gate and injected into the source of the input transistors $802_A$, $802_B$ in the input buffer 800 as illustrated by the signal 922, thereby reducing the common mode voltage variation at the drain with respect to a non-injected example. The sinusoidal test signal 902 is coupled to the gate of the input transistors $702_A$, $702_B$ in the input buffer 700 and an increased common mode voltage variation is observed at the drain, illustrated by the signal 924.

Figure 10:
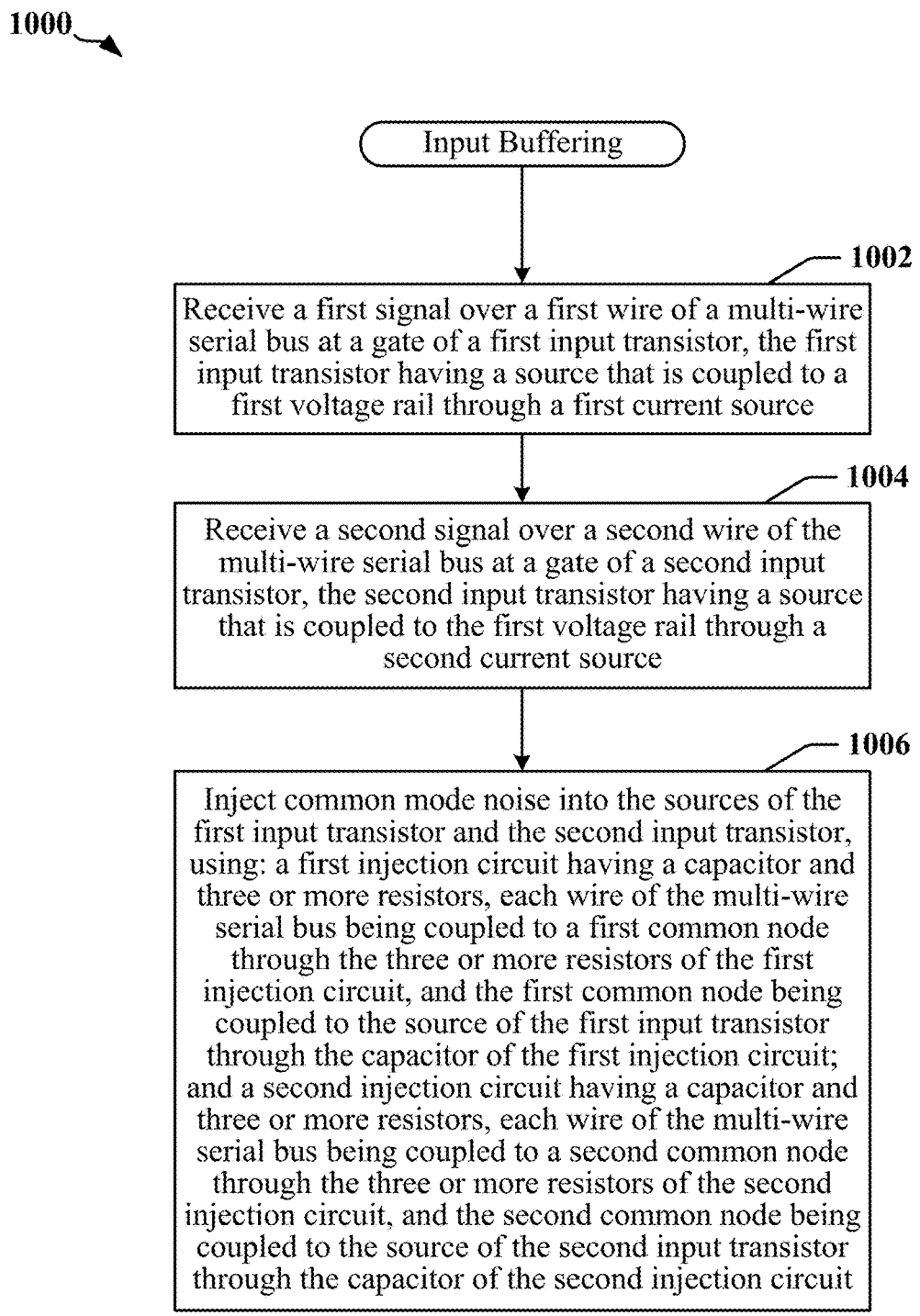
FIG. 10 is a flowchart of a method for buffering signals received from a multi-wire serial bus in accordance with certain aspects of this disclosure.

FIG. 10 is a flowchart 1000 of a method for buffering signals received from a multi-wire serial bus in accordance with certain aspects of this disclosure. The method may relate to the operation of an input buffer. In one example, the method may be implemented in a differential receiver coupled to a three-wire serial bus that is operated in accordance with a MIPI Alliance C-PHY protocol.

At block 1002, a first signal is received over a first wire of a multi-wire serial bus at a gate of a first input transistor. The first input transistor may have a source that is coupled to a first voltage rail through a first current source. At block 1004, a second signal is received over a second wire of the multi-wire serial bus at a gate of a second input transistor. The second input transistor has a source that is coupled to the first voltage rail through a second current source.

At block 1006, common mode noise is injected into the sources of the first input transistor and the second input transistor. The common mode noise may be injected into the source of the first input transistor through a first injection circuit that has a capacitor and three or more resistors. Each wire of the multi-wire serial bus is coupled to a first common node through the three or more resistors of the first injection circuit. The first common node is coupled to the source of the first input transistor through the capacitor of the first injection circuit. The common mode noise may be injected into the source of the second input transistor through a second injection circuit. The second injection circuit has a capacitor and three or more resistors. Each wire of the multi-wire serial bus is coupled to a second common node through the three or more resistors of the second injection circuit. The second common node is coupled to the source of the second input transistor through the capacitor of the second injection circuit.

In certain examples, the multi-wire serial bus is a three-wire serial bus that is operated in accordance with a MIPI Alliance C-PHY protocol. The first injection circuit may include three resistors. In one example, the first injection circuit is associated with a termination impedance that is at least five times greater than a characteristic impedance of the three-wire serial bus. In another example, the first injection circuit presents a resistance to the three-wire serial bus that is at least an order of magnitude greater (i.e., ≥×10) than the characteristic impedance of the three-wire serial bus.

In certain examples, a source degeneration circuit is configured to couple the source of the first input transistor with the source of the second input transistor. The source degeneration circuit may include a programmable resistor-capacitor network. The source degeneration circuit may be configured to control a common mode voltage measured between drains of the first input transistor and the second input transistor.

In certain examples, a drain of the first input transistor is coupled to a second voltage rail through a first output resistor and a drain of the second input transistor is coupled to the second voltage rail through a second output resistor. The first input transistor and the second input transistor are provided in a first stage of a differential receiver circuit and drains of the first input transistor and the second input transistor are coupled to inputs of a second stage of the differential receiver circuit.

In one example, the first injection circuit and the second injection circuit are configured to pass signals generated in a three-wire serial bus by radio frequency interference and to block signals encoded in accordance with a MIPI Alliance C-PHY protocol. In some examples, the input buffer or apparatus may be provided in a first differential receiver circuit. Each combination of two wires in the three-wire serial bus may be coupled to one of three differential receiver circuits.

An apparatus configured or adapted in accordance with certain aspects of this disclosure includes means for buffering a first signal received over a multi-wire serial bus, means for buffering a second signal received over a multi-wire serial bus, and means for injecting common mode noise into the sources of the first input transistor and the second input transistor. The means for buffering the first signal includes a first input transistor having a gate that is coupled to a first wire of the multi-wire serial bus and a source that is coupled to a first voltage rail through a first current source. The means for buffering the second signal includes a second input transistor having a gate that is coupled to a second wire of the multi-wire serial bus and a source that is coupled to the first voltage rail through a second current source. The means for injecting the common mode noise into the sources of the first input transistor and the second input transistor includes a first injection circuit and a second injection circuit. The first injection circuit has a capacitor and three or more resistors, each wire of the multi-wire serial bus being coupled to a first common node through the three or more resistors of the first injection circuit. The first common node may be coupled to the source of the first input transistor through the capacitor of the first injection circuit. The second injection circuit may have a capacitor and three or more resistors, each wire of the multi-wire serial bus being coupled to a second common node through the three or more resistors of the second injection circuit. The second common node may be coupled to the source of the second input transistor through the capacitor of the second injection circuit.

In certain aspects, the multi-wire serial bus is a three-wire serial bus that is operated in accordance with a MIPI Alliance C-PHY protocol. The first injection circuit may include three resistors. Each of the injection circuits may be configured to present an impedance to the three-wire serial bus that does not substantially affect a termination impedance presented to the three-wire serial bus by the apparatus. In one example, the first injection circuit may be associated with a termination impedance that is at least five times greater (i.e., a multiplier ≥×5) than the characteristic impedance of the three-wire serial bus. In one example, the first injection circuit may be associated with a termination impedance that is at least an order of magnitude greater (i.e., a multiplier ≥×10) than the characteristic impedance of the three-wire serial bus. In another example, the combined termination impedance associated with the first injection circuit and the second injection circuit is at least five times greater (i.e., ≥×5) than the characteristic impedance of the three-wire serial bus. In one implementation each resistor in the first injection circuit and the second injection circuit has a nominal resistance value of at least 200Ω.

In certain aspects, the input buffer or apparatus has a source degeneration circuit that is configured to couple the source of the first input transistor with the source of the second input transistor. The source degeneration circuit may include a programmable resistor-capacitor network.

In certain aspects, a drain of the first input transistor is coupled to a second voltage rail through a first output resistor and a drain of the second input transistor is coupled to the second voltage rail through a second output resistor. The input buffer or apparatus may be provided in a first stage of a differential receiver circuit. The drains of the first input transistor and the second input transistor may be coupled to inputs of a second stage of the differential receiver circuit. The input buffer or apparatus may include a source degeneration circuit that couples the source of the first input transistor and the source of the second input transistor. The source degeneration circuit may be configured to control a common mode voltage measured between the drains of the first input transistor and the second input transistor.

In certain aspects, the first injection circuit and the second injection circuit are configured to pass signals generated in a three-wire serial bus by radio frequency interference and to block signals encoded in accordance with a MIPI Alliance C-PHY protocol. The input buffer or apparatus may be provided in a first differential receiver circuit. Each combination of two wires in the three-wire serial bus may be coupled to one of three differential receiver circuits.

An input buffer configured in accordance with certain aspects of this disclosure includes a pair of input transistors and associated injection circuits. A first input transistor has a source that is coupled to a first voltage rail through a first current source and a gate that is coupled to a first wire of a multi-wire serial bus. A first injection circuit includes three or more resistors configured to couple the wires of the multi-wire serial bus to a common node of the first injection circuit. The first injection circuit also includes a capacitor configured to couple the common node of the first injection circuit to the source of the first input transistor. A second input transistor has a source that is coupled to the first voltage rail through a second current source and a gate that is coupled to a second wire of the multi-wire serial bus. A second injection circuit includes three or more resistors configured to couple the wires of the multi-wire serial bus to a common node of the second injection circuit. The second injection circuit also includes a capacitor configured to couple the common node of the second injection circuit to the source of the second input transistor.

In certain implementations, the multi-wire serial bus is a three-wire serial bus that is operated in accordance with a MIPI Alliance C-PHY protocol. The first injection circuit may include three resistors, and the first injection circuit may present a resistance to the three-wire serial bus that is at least double a characteristic impedance of the three-wire serial bus.

In certain implementations, the input buffer or apparatus has a source degeneration circuit that is configured to couple the source of the first input transistor with the source of the second input transistor. The source degeneration circuit may include a programmable resistor-capacitor network.

In certain implementations, a drain of the first input transistor is coupled to a second voltage rail through a first output resistor and a drain of the second input transistor is coupled to the second voltage rail through a second output resistor. The input buffer or apparatus may be provided in a first stage of a differential receiver circuit. The drains of the first input transistor and the second input transistor may be coupled to inputs of a second stage of the differential receiver circuit. The input buffer or apparatus may include a source degeneration circuit that couples the source of the first input transistor and the source of the second input transistor. The source degeneration circuit may be configured to control a common mode voltage measured between the drains of the first input transistor and the second input transistor.

In certain implementations, the first injection circuit and the second injection circuit are configured to pass signals generated in a three-wire serial bus by radio frequency interference and to block signals encoded in accordance with a MIPI Alliance C-PHY protocol. The input buffer or apparatus may be provided in a first differential receiver circuit. Each combination of two wires in the three-wire serial bus may be coupled to one of three differential receiver circuits.

Some implementation examples are described in the following numbered clauses:

1. An input buffer comprising: a first input transistor having a source that is coupled to a first voltage rail through a first current source and a gate coupled to a first wire of a multi-wire serial bus; a first injection circuit comprising: three or more resistors configured to couple the wires of the multi-wire serial bus to a common node of the first injection circuit; and a capacitor configured to couple the common node of the first injection circuit to the source of the first input transistor; a second input transistor having a source that is coupled to the first voltage rail through a second current source and a gate coupled to a second wire of the multi-wire serial bus; and a second injection circuit comprising: three or more resistors configured to couple the wires of the multi-wire serial bus to a common node of the second injection circuit; and a capacitor configured to couple the common node of the second injection circuit to the source of the second input transistor.

2. The input buffer as described in clause 1, wherein the multi-wire serial bus comprises a three-wire serial bus that is operated in accordance with a Mobile Industry Processor Interface (MIPI) Alliance C-PHY protocol.

3. The input buffer as described in clause 2, wherein the first injection circuit comprises three resistors, and wherein the first injection circuit is associated with a termination impedance that is at least five times greater than a characteristic impedance of the three-wire serial bus.

4. The input buffer as described in any of clauses 1-3, further comprising: a source degeneration circuit that is configured to couple the source of the first input transistor with the source of the second input transistor.

5. The input buffer as described in clause 4, wherein the source degeneration circuit comprises a programmable resistor-capacitor network.

6. The input buffer as described in any of clauses 1-5, wherein a drain of the first input transistor is coupled to a second voltage rail through a first output resistor and a drain of the second input transistor is coupled to the second voltage rail through a second output resistor.

7. The input buffer as described in clause 6, wherein the input buffer is provided in a first stage of a differential receiver circuit, and wherein the drains of the first input transistor and the second input transistor are coupled to inputs of a second stage of the differential receiver circuit.

8. The input buffer as described in clause 6 or clause 7, further comprising: a source degeneration circuit that couples the source of the first input transistor and the source of the second input transistor, wherein the source degeneration circuit is configured to control a common mode voltage measured between the drains of the first input transistor and the second input transistor.

9. The input buffer as described in any of clauses 1-8, wherein the first injection circuit and the second injection circuit are configured to pass signals generated in a three-wire serial bus by radio frequency interference and to block signals encoded in accordance with a MIPI Alliance C-PHY protocol.

10. The input buffer as described in any of clauses 1-9, wherein the input buffer is provided in a first differential receiver circuit, and wherein each combination of two wires in a three-wire serial bus is coupled to one of three differential receiver circuits.

11. A method for buffering signals received from a multi-wire serial bus, comprising: receiving a first signal over a first wire of a multi-wire serial bus at a gate of a first input transistor, the first input transistor having a source that is coupled to a first voltage rail through a first current source; receiving a second signal over a second wire of the multi-wire serial bus at a gate of a second input transistor, the second input transistor having a source that is coupled to the first voltage rail through a second current source; and injecting common mode noise into the sources of the first input transistor and the second input transistor, using: a first injection circuit having a capacitor and three or more resistors, each wire of the multi-wire serial bus being coupled to a first common node through the three or more resistors of the first injection circuit, and the first common node being coupled to the source of the first input transistor through the capacitor of the first injection circuit; and a second injection circuit having a capacitor and three or more resistors, each wire of the multi-wire serial bus being coupled to a second common node through the three or more resistors of the second injection circuit, and the second common node being coupled to the source of the second input transistor through the capacitor of the second injection circuit.

12. The method as described in clause 11, wherein the multi-wire serial bus comprises a three-wire serial bus that is operated in accordance with a Mobile Industry Processor Interface (MIPI) Alliance C-PHY protocol.

13. The method as described in clause 12, wherein the first injection circuit comprises three resistors, and wherein the first injection circuit is associated with a termination impedance that is at least five times greater than a characteristic impedance of the three-wire serial bus.

14. The method as described in any of clauses 11-13, wherein a source degeneration circuit is configured to couple the source of the first input transistor with the source of the second input transistor.

15. The method as described in clause 14, wherein the source degeneration circuit comprises a programmable resistor-capacitor network.

16. The method as described in clause 14 or clause 15, further comprising: configuring the source degeneration circuit to control a common mode voltage measured between drains of the first input transistor and the second input transistor.

17. The method as described in any of clauses 11-16, wherein a drain of the first input transistor is coupled to a second voltage rail through a first output resistor and a drain of the second input transistor is coupled to the second voltage rail through a second output resistor.

18. The method as described in clause 17, wherein the first input transistor and the second input transistor are provided in a first stage of a differential receiver circuit and wherein drains of the first input transistor and the second input transistor are coupled to inputs of a second stage of the differential receiver circuit.

19. The method as described in any of clauses 11-18, wherein the first injection circuit and the second injection circuit are configured to pass signals generated in a three-wire serial bus by radio frequency interference and to block signals encoded in accordance with a MIPI Alliance C-PHY protocol.

20. The method as described in any of clauses 11-19, wherein each combination of two wires in a three-wire serial bus is coupled to one of three differential receiver circuits.

21. An apparatus, comprising: means for buffering a first signal received over a multi-wire serial bus, including a first input transistor having a gate that is coupled to a first wire of the multi-wire serial bus and a source that is coupled to a first voltage rail through a first current source; means for buffering a second signal received over a multi-wire serial bus, including a second input transistor having a gate that is coupled to a second wire of the multi-wire serial bus and a source that is coupled to the first voltage rail through a second current source; and means for injecting common mode noise into the sources of the first input transistor and the second input transistor, including: a first injection circuit having a capacitor and three or more resistors, each wire of the multi-wire serial bus being coupled to a first common node through the three or more resistors of the first injection circuit, and the first common node being coupled to the source of the first input transistor through the capacitor of the first injection circuit; and a second injection circuit having a capacitor and three or more resistors, each wire of the multi-wire serial bus being coupled to a second common node through the three or more resistors of the second injection circuit, and the second common node being coupled to the source of the second input transistor through the capacitor of the second injection circuit.

22. The apparatus as described in clause 21, wherein the multi-wire serial bus comprises a three-wire serial bus that is operated in accordance with a Mobile Industry Processor Interface (MIPI) Alliance C-PHY protocol.

23. The apparatus as described in clause 22, wherein the first injection circuit comprises three resistors, and wherein the first injection circuit is associated with a termination impedance that is at least five times greater than a characteristic impedance of the three-wire serial bus.

24. The apparatus as described in any of clauses 21-23, further comprising: a source degeneration circuit that is configured to couple the source of the first input transistor with the source of the second input transistor.

25. The apparatus as described in clause 24, wherein the source degeneration circuit comprises a programmable resistor-capacitor network.

26. The apparatus as described in any of clauses 21-25, wherein a drain of the first input transistor is coupled to a second voltage rail through a first output resistor and a drain of the second input transistor is coupled to the second voltage rail through a second output resistor.

27. The apparatus as described in clause 26, wherein the apparatus is provided in a first stage of a differential receiver circuit, and wherein the drains of the first input transistor and the second input transistor are coupled to inputs of a second stage of the differential receiver circuit.

28. The apparatus as described in clause 26 or clause 27, further comprising: a source degeneration circuit that is configured to control a common mode voltage measured between the drains of the first input transistor and the second input transistor, wherein the source degeneration circuit couples the source of the first input transistor with the source of the second input transistor.

29. The apparatus as described in any of clauses 21-28, wherein the first injection circuit and the second injection circuit are configured to pass signals generated in a three-wire serial bus by radio frequency interference and to block signals encoded in accordance with a MIPI Alliance C-PHY protocol.

30. The apparatus as described in any of clauses 21-29, wherein the apparatus comprises three differential receiver circuits, and wherein each combination of two wires in a three-wire serial bus is coupled to one of the three differential receiver circuits.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An input buffer comprising:
   a first input transistor having a source that is coupled to a first voltage rail through a first current source and a gate coupled to a first wire of a multi-wire serial bus;
   a first injection circuit comprising:
      three or more resistors configured to couple the wires of the multi-wire serial bus to a common node of the first injection circuit; and
      a capacitor configured to couple the common node of the first injection circuit to the source of the first input transistor;
   a second input transistor having a source that is coupled to the first voltage rail through a second current source and a gate coupled to a second wire of the multi-wire serial bus; and
   a second injection circuit comprising:
      three or more resistors configured to couple the wires of the multi-wire serial bus to a common node of the second injection circuit; and
      a capacitor configured to couple the common node of the second injection circuit to the source of the second input transistor;
   wherein the input buffer is provided in a first differential receiver circuit, and wherein each combination of two wires in a three-wire serial bus is coupled to one of three differential receiver circuits.

2. The input buffer of claim 1, wherein the multi-wire serial bus comprises a three-wire serial bus that is operated in accordance with a Mobile Industry Processor Interface (MIPI) Alliance C-PHY protocol.

3. The input buffer of claim 2, wherein the first injection circuit comprises three resistors, and wherein the first injection circuit is associated with a termination impedance that is at least five times greater than a characteristic impedance of the three-wire serial bus.

4. The input buffer of claim 1, further comprising:
a source degeneration circuit that is configured to couple the source of the first input transistor with the source of the second input transistor.

5. The input buffer of claim 4, wherein the source degeneration circuit comprises a programmable resistor-capacitor network.

6. The input buffer of claim 1, wherein a drain of the first input transistor is coupled to a second voltage rail through a first output resistor and a drain of the second input transistor is coupled to the second voltage rail through a second output resistor.

7. The input buffer of claim 6, wherein the input buffer is provided in a first stage of a differential receiver circuit, and wherein the drains of the first input transistor and the second input transistor are coupled to inputs of a second stage of the differential receiver circuit.

8. The input buffer of claim 6, further comprising:
a source degeneration circuit that couples the source of the first input transistor and the source of the second input transistor,
wherein the source degeneration circuit is configured to control a common mode voltage measured between the drains of the first input transistor and the second input transistor.

9. The input buffer of claim 1, wherein the first injection circuit and the second injection circuit are configured to pass signals generated in a three-wire serial bus by radio frequency interference and to block signals encoded in accordance with a MIPI Alliance C-PHY protocol.

10. A method for buffering signals received from a multi-wire serial bus, comprising:
receiving a first signal over a first wire of a multi-wire serial bus at a gate of a first input transistor, the first input transistor having a source that is coupled to a first voltage rail through a first current source;
receiving a second signal over a second wire of the multi-wire serial bus at a gate of a second input transistor, the second input transistor having a source that is coupled to the first voltage rail through a second current source; and
injecting common mode noise into the sources of the first input transistor and the second input transistor, using:
a first injection circuit having a capacitor and three or more resistors, each wire of the multi-wire serial bus being coupled to a first common node through the three or more resistors of the first injection circuit, and the first common node being coupled to the source of the first input transistor through the capacitor of the first injection circuit; and
a second injection circuit having a capacitor and three or more resistors, each wire of the multi-wire serial bus being coupled to a second common node through the three or more resistors of the second injection circuit, and the second common node being coupled to the source of the second input transistor through the capacitor of the second injection circuit;
wherein each combination of two wires in a three-wire serial bus is coupled to one of three differential receiver circuits.

11. The method of claim 10, wherein the multi-wire serial bus comprises a three-wire serial bus that is operated in accordance with a Mobile Industry Processor Interface (MIPI) Alliance C-PHY protocol.

12. The method of claim 11, wherein the first injection circuit comprises three resistors, and wherein the first injection circuit is associated with a termination impedance that is at least five times greater than a characteristic impedance of the three-wire serial bus.

13. The method of claim 10, wherein a source degeneration circuit is configured to couple the source of the first input transistor with the source of the second input transistor.

14. The method of claim 13, wherein the source degeneration circuit comprises a programmable resistor-capacitor network.

15. The method of claim 13, further comprising:
configuring the source degeneration circuit to control a common mode voltage measured between drains of the first input transistor and the second input transistor.

16. The method of claim 10, wherein a drain of the first input transistor is coupled to a second voltage rail through a first output resistor and a drain of the second input transistor is coupled to the second voltage rail through a second output resistor.

17. The method of claim 16, wherein the first input transistor and the second input transistor are provided in a first stage of a differential receiver circuit and wherein drains of the first input transistor and the second input transistor are coupled to inputs of a second stage of the differential receiver circuit.

18. The method of claim 10, wherein the first injection circuit and the second injection circuit are configured to pass signals generated in a three-wire serial bus by radio frequency interference and to block signals encoded in accordance with a MIPI Alliance C-PHY protocol.

19. An apparatus, comprising:
means for buffering a first signal received over a multi-wire serial bus, including a first input transistor having a gate that is coupled to a first wire of the multi-wire serial bus and a source that is coupled to a first voltage rail through a first current source;
means for buffering a second signal received over the multi-wire serial bus, including a second input transistor having a gate that is coupled to a second wire of the multi-wire serial bus and a source that is coupled to the first voltage rail through a second current source;
means for injecting common mode noise into the sources of the first input transistor and the second input transistor, including:
a first injection circuit having a capacitor and three or more resistors, each wire of the multi-wire serial bus being coupled to a first common node through the three or more resistors of the first injection circuit, and the first common node being coupled to the source of the first input transistor through the capacitor of the first injection circuit; and
a second injection circuit having a capacitor and three or more resistors, each wire of the multi-wire serial bus being coupled to a second common node through the three or more resistors of the second injection circuit, and the second common node being coupled to the source of the second input transistor through the capacitor of the second injection circuit; and
three differential receiver circuits, wherein each combination of two wires in a three-wire serial bus is coupled to one of the three differential receiver circuits.

20. The apparatus of claim 19, wherein the multi-wire serial bus comprises a three-wire serial bus that is operated in accordance with a Mobile Industry Processor Interface (MIPI) Alliance C-PHY protocol.

21. The apparatus of claim 20, wherein the first injection circuit comprises three resistors, and wherein the first injection circuit is associated with a termination impedance that is at least five times greater than a characteristic impedance of the three-wire serial bus.

22. The apparatus of claim 19, further comprising:
a source degeneration circuit that is configured to couple the source of the first input transistor with the source of the second input transistor.

23. The apparatus of claim 22, wherein the source degeneration circuit comprises a programmable resistor-capacitor network.

24. The apparatus of claim 19, wherein a drain of the first input transistor is coupled to a second voltage rail through a first output resistor and a drain of the second input transistor is coupled to the second voltage rail through a second output resistor.

25. The apparatus of claim 24, wherein the apparatus is provided in a first stage of a differential receiver circuit, and wherein the drains of the first input transistor and the second input transistor are coupled to inputs of a second stage of the differential receiver circuit.

26. The apparatus of claim 24, further comprising:
a source degeneration circuit that is configured to control a common mode voltage measured between the drains of the first input transistor and the second input transistor, wherein the source degeneration circuit couples the source of the first input transistor with the source of the second input transistor.

27. The apparatus of claim 19, wherein the first injection circuit and the second injection circuit are configured to pass signals generated in a three-wire serial bus by radio frequency interference and to block signals encoded in accordance with a MIPI Alliance C-PHY protocol.

\* \* \* \* \*